(12) United States Patent
Sandhu et al.

(10) Patent No.: US 8,501,563 B2
(45) Date of Patent: Aug. 6, 2013

(54) DEVICES WITH NANOCRYSTALS AND METHODS OF FORMATION

(75) Inventors: Gurtej S. Sandhu, Boise, ID (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/614,794

(22) Filed: Sep. 13, 2012

(65) Prior Publication Data

US 2013/0017655 A1    Jan. 17, 2013

Related U.S. Application Data

(62) Division of application No. 13/088,777, filed on Apr. 18, 2011, now Pat. No. 8,288,818, which is a division of application No. 11/185,113, filed on Jul. 20, 2005, now Pat. No. 7,927,948.

(51) Int. Cl.
*H01L 21/336* (2006.01)

(52) U.S. Cl.
USPC .......................................... 438/257; 438/962

(58) Field of Classification Search
USPC .................................. 438/257, 962
See application file for complete search history.

(56) References Cited

U.S. PATENT DOCUMENTS

| | | | |
|---|---|---|---|
| 2,501,563 A | 3/1950 | Colbert, et al. |
| 3,357,961 A | 12/1967 | Makowski, et al. |
| 3,381,114 A | 4/1968 | Nakanuma |
| 3,407,479 A | 10/1968 | Fordemwalt, et al. |
| 3,457,123 A | 7/1969 | Van Pul |
| 3,471,754 A | 10/1969 | Hoshi, et al. |
| 3,478,230 A | 11/1969 | Otter, Jr., et al. |
| 3,488,633 A | 1/1970 | King, et al. |
| 3,506,438 A | 4/1970 | Krock, et al. |
| 3,571,918 A | 3/1971 | Habercchi |
| 3,595,644 A | 7/1971 | Hill, et al. |
| 3,641,516 A | 2/1972 | Casrucci et al. |

(Continued)

FOREIGN PATENT DOCUMENTS

| CN | 1169029 A | 12/1997 |
|---|---|---|
| DE | 19507562 A1 | 9/1995 |

(Continued)

OTHER PUBLICATIONS

"Rossini, Pentium, PCI-ISA, Chip Set", Symphony Laboratories (1995), pp. 1-123.

(Continued)

*Primary Examiner* — Lex Malsawma
(74) *Attorney, Agent, or Firm* — Schwegman, Lundberg & Woessner, P.A.

(57) ABSTRACT

Devices can be fabricated using a method of growing nanoscale structures on a semiconductor substrate. According to various embodiments, nucleation sites can be created on a surface of the substrate. The creation of the nucleation sites may include implanting ions with an energy and a dose selected to provide a controllable distribution of the nucleation sites across the surface of the substrate. Nanoscale structures may be grown using the controllable distribution of nucleation sites to seed the growth of the nanoscale structures. According to various embodiments, the nanoscale structures may include at least one of nanocrystals, nanowires, or nanotubes. According to various nanocrystal embodiments, the nanocrystals can be positioned within a gate stack and function as a floating gate for a nonvolatile device. Other embodiments are provided herein.

26 Claims, 3 Drawing Sheets

U.S. PATENT DOCUMENTS

| | | |
|---|---|---|
| 3,665,423 A | 5/1972 | Nakamuma et al. |
| 3,676,718 A | 7/1972 | Anderson et al. |
| 3,689,357 A | 9/1972 | Jordan |
| 3,738,817 A | 6/1973 | Benjamin |
| 3,743,550 A | 7/1973 | Masumoto et al. |
| 3,816,673 A | 6/1974 | Miya |
| 3,833,386 A | 9/1974 | Wood et al. |
| 3,877,054 A | 4/1975 | Boulin et al. |
| 3,903,232 A | 9/1975 | Wood et al. |
| 3,926,568 A | 12/1975 | Benjamin et al. |
| 3,953,566 A | 4/1976 | Gore |
| 3,956,195 A | 5/1976 | Topchiashvili et al. |
| 3,959,191 A | 5/1976 | Kehr et al. |
| 3,962,153 A | 6/1976 | Gore |
| 3,964,085 A | 6/1976 | Kahng et al. |
| 4,017,322 A | 4/1977 | Kawai et al. |
| 4,051,354 A | 9/1977 | Choate |
| 4,058,430 A | 11/1977 | Suntola et al. |
| 4,096,227 A | 6/1978 | Gore |
| 4,137,200 A | 1/1979 | Wood et al. |
| 4,152,627 A | 5/1979 | Priel et al. |
| 4,209,357 A | 6/1980 | Gorin et al. |
| 4,215,156 A | 7/1980 | Dalal et al. |
| 4,217,601 A | 8/1980 | DeKeersmaecker et al. |
| 4,292,093 A | 9/1981 | Ownby et al. |
| 4,293,679 A | 10/1981 | Cogliano |
| 4,295,150 A | 10/1981 | Adam |
| 4,302,620 A | 11/1981 | Chu |
| 4,305,640 A | 12/1981 | Cullis et al. |
| 4,308,421 A | 12/1981 | Bogese, II |
| 4,333,808 A | 6/1982 | Bhattacharyya et al. |
| 4,339,305 A | 7/1982 | Jones |
| 4,344,156 A | 8/1982 | Eaton et al. |
| 4,345,366 A | 8/1982 | Brower |
| 4,355,377 A | 10/1982 | Sud et al. |
| 4,358,397 A | 11/1982 | Chu |
| 4,368,350 A | 1/1983 | Perelman |
| 4,372,032 A | 2/1983 | Collins et al. |
| 4,390,586 A | 6/1983 | Lemelson |
| 4,394,673 A | 7/1983 | Thompson et al. |
| 4,399,424 A | 8/1983 | Rigby |
| 4,403,083 A | 9/1983 | Marans et al. |
| 4,412,902 A | 11/1983 | Michikami et al. |
| 4,413,022 A | 11/1983 | Suntola et al. |
| 4,482,516 A | 11/1984 | Bowman et al. |
| 4,484,308 A | 11/1984 | Lewandowski et al. |
| 4,491,482 A | 1/1985 | Hori |
| 4,507,673 A | 3/1985 | Aoyama et al. |
| 4,510,603 A | 4/1985 | Catiller |
| 4,513,389 A | 4/1985 | Devchoudhury |
| 4,556,975 A | 12/1985 | Smith et al. |
| 4,561,173 A | 12/1985 | Te Velde |
| 4,562,555 A | 12/1985 | Ouchi et al. |
| 4,567,579 A | 1/1986 | Patel et al. |
| 4,575,825 A | 3/1986 | Ozaki et al. |
| 4,590,042 A | 5/1986 | Drage |
| 4,603,403 A | 7/1986 | Toda |
| 4,604,162 A | 8/1986 | Sobczak |
| 4,608,215 A | 8/1986 | Gonczy et al. |
| 4,613,549 A | 9/1986 | Tanaka |
| 4,618,947 A | 10/1986 | Tran et al. |
| 4,636,833 A | 1/1987 | Nishioka et al. |
| 4,636,986 A | 1/1987 | Pinkham |
| 4,640,871 A | 2/1987 | Hayashi et al. |
| 4,641,313 A | 2/1987 | Tobin et al. |
| 4,645,622 A | 2/1987 | Kock |
| 4,647,947 A | 3/1987 | Takeoka et al. |
| 4,649,522 A | 3/1987 | Kirsch |
| 4,661,833 A | 4/1987 | Mizutani |
| 4,663,831 A | 5/1987 | Birrittella et al. |
| 4,667,313 A | 5/1987 | Pinkham et al. |
| 4,672,240 A | 6/1987 | Smith et al. |
| 4,673,962 A | 6/1987 | Chatterjee et al. |
| 4,685,089 A | 8/1987 | Patel et al. |
| 4,688,078 A | 8/1987 | Hseih |
| 4,689,741 A | 8/1987 | Redwine et al. |
| 4,693,211 A | 9/1987 | Ogami et al. |
| 4,694,562 A | 9/1987 | Iwasaki et al. |
| 4,707,811 A | 11/1987 | Takemae et al. |
| 4,725,877 A | 2/1988 | Brasen et al. |
| 4,725,887 A | 2/1988 | Field |
| 4,737,472 A | 4/1988 | Schaber et al. |
| 4,749,888 A | 6/1988 | Sakai et al. |
| 4,750,839 A | 6/1988 | Wang et al. |
| 4,757,360 A | 7/1988 | Faraone |
| 4,761,768 A | 8/1988 | Turner et al. |
| 4,764,482 A | 8/1988 | Hsu |
| 4,766,569 A | 8/1988 | Turner et al. |
| 4,767,641 A | 8/1988 | Kieser et al. |
| 4,780,424 A | 10/1988 | Holler |
| 4,788,667 A | 11/1988 | Nakano et al. |
| 4,799,199 A | 1/1989 | Scales et al. |
| 4,818,720 A | 4/1989 | Iwasaki |
| 4,847,213 A | 7/1989 | Pfiester |
| 4,847,758 A | 7/1989 | Olson et al. |
| 4,857,478 A | 8/1989 | Niwano |
| 4,864,375 A | 9/1989 | Teng et al. |
| 4,870,622 A | 9/1989 | Aria et al. |
| 4,870,923 A | 10/1989 | Sugimoto |
| 4,875,192 A | 10/1989 | Matsumoto |
| 4,888,733 A | 12/1989 | Mobley |
| 4,891,794 A | 1/1990 | Hush et al. |
| 4,894,801 A | 1/1990 | Saito et al. |
| 4,896,293 A | 1/1990 | McElroy |
| 4,902,533 A | 2/1990 | White et al. |
| 4,902,640 A | 2/1990 | Sachitano et al. |
| 4,920,065 A | 4/1990 | Chin et al. |
| 4,920,071 A | 4/1990 | Thomas |
| 4,920,396 A | 4/1990 | Shinohara et al. |
| 4,926,224 A | 5/1990 | Redwine |
| 4,926,314 A | 5/1990 | Dhuey |
| 4,929,570 A | 5/1990 | Howell |
| 4,933,743 A | 6/1990 | Thomas et al. |
| 4,933,910 A | 6/1990 | Olson et al. |
| 4,939,559 A | 7/1990 | DiMaria et al. |
| 4,940,636 A | 7/1990 | Brock et al. |
| 4,947,221 A | 8/1990 | Stewart et al. |
| 4,948,937 A | 8/1990 | Blank et al. |
| 4,954,854 A | 9/1990 | Dhong et al. |
| 4,958,088 A | 9/1990 | Farah-Bakhsh et al. |
| 4,958,318 A | 9/1990 | Harari |
| 4,960,726 A | 10/1990 | Lechaton et al. |
| 4,961,004 A | 10/1990 | Bryan et al. |
| 4,962,058 A | 10/1990 | Cronin et al. |
| 4,962,476 A | 10/1990 | Kawada |
| 4,962,879 A | 10/1990 | Goesele et al. |
| 4,963,753 A | 10/1990 | Bryan et al. |
| 4,963,754 A | 10/1990 | Bryan et al. |
| 4,966,861 A | 10/1990 | Mieno et al. |
| 4,967,085 A | 10/1990 | Bryan et al. |
| 4,967,087 A | 10/1990 | Bryan et al. |
| 4,972,086 A | 11/1990 | Bryan et al. |
| 4,972,516 A | 11/1990 | Bryan et al. |
| 4,975,014 A | 12/1990 | Rufin et al. |
| 4,975,588 A | 12/1990 | Bryan et al. |
| 4,980,559 A | 12/1990 | Bryan et al. |
| 4,980,560 A | 12/1990 | Bryan et al. |
| 4,983,847 A | 1/1991 | Bryan et al. |
| 4,984,217 A | 1/1991 | Sato |
| 4,987,089 A | 1/1991 | Roberts |
| 4,988,880 A | 1/1991 | Bryan et al. |
| 4,990,282 A | 2/1991 | Bryan et al. |
| 4,992,205 A | 2/1991 | Bryan et al. |
| 4,993,027 A | 2/1991 | McGraw et al. |
| 4,993,358 A | 2/1991 | Mahawili |
| 4,994,205 A | 2/1991 | Bryan et al. |
| 4,996,003 A | 2/1991 | Bryan et al. |
| 5,001,526 A | 3/1991 | Gotou |
| 5,006,192 A | 4/1991 | Deguchi |
| 5,006,909 A | 4/1991 | Kosa |
| 5,008,034 A | 4/1991 | Bryan et al. |
| 5,010,386 A | 4/1991 | Groover, III |
| 5,017,504 A | 5/1991 | Nishimura et al. |
| 5,017,791 A | 5/1991 | Bryan et al. |
| 5,019,728 A | 5/1991 | Sanwo et al. |
| 5,021,355 A | 6/1991 | Dhong et al. |
| 5,021,999 A | 6/1991 | Kohda et al. |

| Patent No. | Date | Inventor |
|---|---|---|
| 5,027,171 A | 6/1991 | Reedy et al. |
| 5,028,977 A | 7/1991 | Kenneth et al. |
| 5,032,545 A | 7/1991 | Doan et al. |
| 5,034,623 A | 7/1991 | McAdams |
| 5,037,773 A | 8/1991 | Lee et al. |
| 5,042,011 A | 8/1991 | Casper et al. |
| 5,045,493 A | 9/1991 | Kameyama et al. |
| 5,049,516 A | 9/1991 | Arima |
| 5,053,351 A | 10/1991 | Fazan et al. |
| 5,055,319 A | 10/1991 | Bunshah et al. |
| 5,057,447 A | 10/1991 | Paterson |
| 5,057,896 A | 10/1991 | Gotou |
| 5,058,066 A | 10/1991 | Yu |
| 5,059,549 A | 10/1991 | Furuhatta |
| 5,071,782 A | 12/1991 | Mori |
| 5,072,269 A | 12/1991 | Hieda |
| 5,073,519 A | 12/1991 | Rodder |
| 5,075,536 A | 12/1991 | Towe et al. |
| 5,080,928 A | 1/1992 | Klinedinst et al. |
| 5,083,296 A | 1/1992 | Hara et al. |
| 5,084,606 A | 1/1992 | Bailey et al. |
| 5,089,084 A | 2/1992 | Chhabra et al. |
| 5,095,218 A | 3/1992 | Bryan et al. |
| 5,097,291 A | 3/1992 | Suzuki |
| 5,100,825 A | 3/1992 | Fazan et al. |
| 5,102,817 A | 4/1992 | Chatterjee et al. |
| 5,103,288 A | 4/1992 | Sakamoto et al. |
| 5,110,752 A | 5/1992 | Lu |
| 5,111,430 A | 5/1992 | Morie |
| 5,119,329 A | 6/1992 | Evans et al. |
| 5,121,360 A | 6/1992 | West et al. |
| 5,122,848 A | 6/1992 | Lee et al. |
| 5,122,856 A | 6/1992 | Komiya |
| 5,126,975 A | 6/1992 | Handy et al. |
| 5,128,382 A | 7/1992 | Elliott, Jr. et al. |
| 5,128,962 A | 7/1992 | Kerslake et al. |
| 5,132,234 A | 7/1992 | Kim et al. |
| 5,135,879 A | 8/1992 | Richardson |
| 5,135,889 A | 8/1992 | Allen |
| 5,137,780 A | 8/1992 | Nichols et al. |
| 5,149,596 A | 9/1992 | Smith et al. |
| 5,153,880 A | 10/1992 | Owen et al. |
| 5,155,704 A | 10/1992 | Walther et al. |
| 5,156,987 A | 10/1992 | Sandhu et al. |
| 5,158,463 A | 10/1992 | Kim et al. |
| 5,158,986 A | 10/1992 | Cha et al. |
| 5,158,989 A | 10/1992 | Ogitani et al. |
| 5,165,046 A | 11/1992 | Hesson |
| 5,171,713 A | 12/1992 | Matthews |
| 5,173,442 A | 12/1992 | Carey |
| 5,177,028 A | 1/1993 | Manning |
| 5,177,576 A | 1/1993 | Kimura et al. |
| 5,191,404 A | 3/1993 | Wu et al. |
| 5,192,704 A | 3/1993 | McDavid et al. |
| 5,192,871 A | 3/1993 | Ramakrishnan et al. |
| 5,192,992 A | 3/1993 | Kim et al. |
| 5,196,356 A | 3/1993 | Won et al. |
| 5,198,029 A | 3/1993 | Dutta et al. |
| 5,202,278 A | 4/1993 | Mathews et al. |
| 5,202,587 A | 4/1993 | McLaury |
| 5,208,169 A | 5/1993 | Shah et al. |
| 5,208,657 A | 5/1993 | Chatterjee et al. |
| 5,210,723 A | 5/1993 | Bates et al. |
| 5,212,442 A | 5/1993 | O'Toole et al. |
| 5,216,266 A | 6/1993 | Ozaki |
| 5,223,001 A | 6/1993 | Saeki |
| 5,223,081 A | 6/1993 | Doan |
| 5,223,808 A | 6/1993 | Lee et al. |
| 5,229,647 A | 7/1993 | Gnadinger |
| 5,234,535 A | 8/1993 | Beyer et al. |
| 5,235,545 A | 8/1993 | McLaury |
| 5,237,689 A | 8/1993 | Behnke |
| 5,241,211 A | 8/1993 | Tashiro |
| 5,242,666 A | 9/1993 | Aoki |
| 5,245,522 A | 9/1993 | Kawaguchi et al. |
| 5,245,578 A | 9/1993 | McLaury |
| 5,253,196 A | 10/1993 | Shimabukuro |
| 5,253,357 A | 10/1993 | Allen et al. |
| 5,254,499 A | 10/1993 | Sandhu et al. |
| 5,260,646 A | 11/1993 | Ong |
| 5,265,050 A | 11/1993 | McLaury |
| 5,266,510 A | 11/1993 | Lee |
| 5,266,514 A | 11/1993 | Tuan et al. |
| 5,267,200 A | 11/1993 | Tobita |
| 5,268,865 A | 12/1993 | Takasugi |
| 5,272,367 A | 12/1993 | Dennison et al. |
| 5,278,460 A | 1/1994 | Casper |
| 5,280,205 A | 1/1994 | Green et al. |
| 5,280,594 A | 1/1994 | Young et al. |
| 5,282,177 A | 1/1994 | McLaury |
| 5,283,762 A | 2/1994 | Fujishima |
| 5,286,991 A | 2/1994 | Hui et al. |
| 5,293,560 A | 3/1994 | Harari |
| 5,294,571 A | 3/1994 | Fujishiro et al. |
| 5,295,095 A | 3/1994 | Josephson |
| 5,298,447 A | 3/1994 | Hong |
| 5,301,278 A | 4/1994 | Bowater et al. |
| 5,302,461 A | 4/1994 | Anthony |
| 5,303,555 A | 4/1994 | Chrysler et al. |
| 5,304,622 A | 4/1994 | Ikai et al. |
| 5,305,284 A | 4/1994 | Iwase |
| 5,307,320 A | 4/1994 | Farrer et al. |
| 5,311,478 A | 5/1994 | Zagar et al. |
| 5,311,481 A | 5/1994 | Casper et al. |
| 5,316,962 A | 5/1994 | Matsuo et al. |
| 5,317,535 A | 5/1994 | Talreja et al. |
| 5,319,759 A | 6/1994 | Chan |
| 5,320,880 A | 6/1994 | Sandhu et al. |
| 5,323,350 A | 6/1994 | McLaury |
| 5,323,352 A | 6/1994 | Miyata et al. |
| 5,324,683 A | 6/1994 | Fitch et al. |
| 5,324,980 A | 6/1994 | Kusunoki |
| 5,325,330 A | 6/1994 | Morgan |
| 5,325,502 A | 6/1994 | McLaury |
| 5,327,380 A | 7/1994 | Kersh, III et al. |
| 5,331,593 A | 7/1994 | Merritt et al. |
| 5,333,305 A | 7/1994 | Neufeld |
| 5,334,356 A | 8/1994 | Baldwin et al. |
| 5,335,336 A | 8/1994 | Kametani |
| 5,336,922 A | 8/1994 | Sakamoto |
| 5,339,276 A | 8/1994 | Takasugi |
| 5,340,843 A | 8/1994 | Tsuruta et al. |
| 5,341,033 A | 8/1994 | Koker |
| 5,347,177 A | 9/1994 | Lipp |
| 5,349,559 A | 9/1994 | Park et al. |
| 5,349,566 A | 9/1994 | Merritt et al. |
| 5,350,738 A | 9/1994 | Hase et al. |
| 5,352,998 A | 10/1994 | Tanino |
| 5,353,431 A | 10/1994 | Doyle et al. |
| 5,354,699 A | 10/1994 | Ikeda et al. |
| 5,357,469 A | 10/1994 | Sommer et al. |
| 5,358,884 A | 10/1994 | Violette |
| 5,360,751 A | 11/1994 | Lee |
| 5,360,769 A | 11/1994 | Thakur et al. |
| 5,361,002 A | 11/1994 | Casper |
| 5,362,981 A | 11/1994 | Sato et al. |
| 5,363,330 A | 11/1994 | Kobayashi et al. |
| 5,363,550 A | 11/1994 | Aitken et al. |
| 5,365,477 A | 11/1994 | Cooper, Jr. et al. |
| 5,369,622 A | 11/1994 | McLaury |
| 5,373,227 A | 12/1994 | Keeth |
| 5,376,575 A | 12/1994 | Kim et al. |
| 5,376,593 A | 12/1994 | Sandhu et al. |
| 5,379,255 A | 1/1995 | Shah |
| 5,379,261 A | 1/1995 | Jones, Jr. |
| 5,381,368 A | 1/1995 | Morgan et al. |
| 5,382,533 A | 1/1995 | Ahmad et al. |
| 5,382,540 A | 1/1995 | Sharma et al. |
| 5,386,385 A | 1/1995 | Stephens, Jr. |
| 5,388,069 A | 2/1995 | Kokubo |
| 5,391,510 A | 2/1995 | Hsu et al. |
| 5,391,911 A | 2/1995 | Beyer et al. |
| 5,392,239 A | 2/1995 | Margulis et al. |
| 5,392,245 A | 2/1995 | Manning |
| 5,393,704 A | 2/1995 | Huang et al. |
| 5,394,535 A | 2/1995 | Ohuchi |
| 5,396,093 A | 3/1995 | Lu |
| 5,399,516 A | 3/1995 | Bergendahl et al. |

| Patent | Date | Inventor |
|---|---|---|
| 5,400,292 A | 3/1995 | Fukiage et al. |
| 5,406,527 A | 4/1995 | Honma |
| 5,408,742 A | 4/1995 | Zaidel et al. |
| 5,409,858 A | 4/1995 | Thakur et al. |
| 5,410,169 A | 4/1995 | Yamamoto et al. |
| 5,410,504 A | 4/1995 | Ward |
| 5,410,670 A | 4/1995 | Hansen et al. |
| 5,411,912 A | 5/1995 | Sakamoto |
| 5,414,287 A | 5/1995 | Hong |
| 5,414,288 A | 5/1995 | Fitch et al. |
| 5,416,041 A | 5/1995 | Schwalke |
| 5,418,389 A | 5/1995 | Watanabe |
| 5,421,953 A | 6/1995 | Nagakubo et al. |
| 5,422,499 A | 6/1995 | Manning |
| 5,424,993 A | 6/1995 | Lee et al. |
| 5,426,603 A | 6/1995 | Nakamura et al. |
| 5,427,972 A | 6/1995 | Shimizu et al. |
| 5,429,966 A | 7/1995 | Wu et al. |
| 5,430,670 A | 7/1995 | Rosenthal |
| 5,432,739 A | 7/1995 | Pein |
| 5,434,815 A | 7/1995 | Smarandoiu et al. |
| 5,434,878 A | 7/1995 | Lawandy |
| 5,436,869 A | 7/1995 | Yoshida |
| 5,438,009 A | 8/1995 | Yang et al. |
| 5,438,539 A | 8/1995 | Mori |
| 5,438,544 A | 8/1995 | Makino |
| 5,439,524 A | 8/1995 | Cain et al. |
| 5,439,833 A | 8/1995 | Hebert et al. |
| 5,440,158 A | 8/1995 | Sung-Mu |
| 5,441,591 A | 8/1995 | Imthurn et al. |
| 5,444,013 A | 8/1995 | Akram et al. |
| 5,444,279 A | 8/1995 | Lee |
| 5,444,303 A | 8/1995 | Greenwood et al. |
| 5,445,699 A | 8/1995 | Kamikawa et al. |
| 5,445,986 A | 8/1995 | Hirota |
| 5,445,999 A | 8/1995 | Thakur et al. |
| 5,448,199 A | 9/1995 | Park |
| 5,449,427 A | 9/1995 | Wojnarowski et al. |
| 5,449,433 A | 9/1995 | Donohoe |
| 5,449,941 A | 9/1995 | Yamazaki et al. |
| 5,450,026 A | 9/1995 | Morano |
| 5,450,355 A | 9/1995 | Hush |
| 5,452,253 A | 9/1995 | Choi |
| 5,452,259 A | 9/1995 | McLaury |
| 5,452,261 A | 9/1995 | Chung et al. |
| 5,454,107 A | 9/1995 | Lehman et al. |
| 5,455,444 A | 10/1995 | Hsue |
| 5,455,445 A | 10/1995 | Kurtz et al. |
| 5,455,489 A | 10/1995 | Bhargava |
| 5,457,649 A | 10/1995 | Eichman et al. |
| 5,457,654 A | 10/1995 | McLaury |
| 5,457,659 A | 10/1995 | Schaefer |
| 5,460,316 A | 10/1995 | Hefele |
| 5,460,988 A | 10/1995 | Hong |
| 5,461,003 A | 10/1995 | Havemann et al. |
| 5,465,232 A | 11/1995 | Ong et al. |
| 5,466,625 A | 11/1995 | Hsieh et al. |
| 5,467,306 A | 11/1995 | Kaya et al. |
| 5,470,802 A | 11/1995 | Gnade et al. |
| 5,473,814 A | 12/1995 | White |
| 5,474,947 A | 12/1995 | Chang et al. |
| 5,477,485 A | 12/1995 | Bergemont et al. |
| 5,480,048 A | 1/1996 | Kitamura et al. |
| 5,483,094 A | 1/1996 | Sharma et al. |
| 5,483,487 A | 1/1996 | Sung-Mu |
| 5,483,498 A | 1/1996 | Hotta |
| 5,485,422 A | 1/1996 | Bauer et al. |
| 5,485,428 A | 1/1996 | Lin |
| 5,486,493 A | 1/1996 | Jeng |
| 5,487,049 A | 1/1996 | Hang |
| 5,488,612 A | 1/1996 | Heybruck |
| 5,490,112 A | 2/1996 | Hush et al. |
| 5,492,853 A | 2/1996 | Jeng et al. |
| 5,493,140 A | 2/1996 | Iguchi |
| 5,493,532 A | 2/1996 | McClure |
| 5,494,844 A | 2/1996 | Suzuki |
| 5,495,441 A | 2/1996 | Hong |
| 5,496,597 A | 3/1996 | Soininen et al. |
| 5,497,017 A | 3/1996 | Gonzales |
| 5,497,117 A | 3/1996 | Nakajima et al. |
| 5,497,494 A | 3/1996 | Combs et al. |
| 5,498,558 A | 3/1996 | Kapoor |
| 5,499,355 A | 3/1996 | Krishnamohan et al. |
| 5,504,022 A | 4/1996 | Nakanishi et al. |
| 5,504,357 A | 4/1996 | Kim et al. |
| 5,504,376 A | 4/1996 | Sugahara et al. |
| 5,506,814 A | 4/1996 | Hush et al. |
| 5,508,219 A | 4/1996 | Bronner et al. |
| 5,508,542 A | 4/1996 | Geiss et al. |
| 5,508,543 A | 4/1996 | Hartstein et al. |
| 5,508,544 A | 4/1996 | Shah |
| 5,510,645 A | 4/1996 | Fitch et al. |
| 5,510,758 A | 4/1996 | Fujita et al. |
| 5,511,020 A | 4/1996 | Hu et al. |
| 5,513,148 A | 4/1996 | Zagar |
| 5,516,588 A | 5/1996 | van den Berg et al. |
| 5,519,236 A | 5/1996 | Ozaki |
| 5,521,536 A | 5/1996 | Yamashita et al. |
| 5,522,064 A | 5/1996 | Aldereguia et al. |
| 5,522,932 A | 6/1996 | Wong et al. |
| 5,523,261 A | 6/1996 | Sandhu |
| 5,525,530 A | 6/1996 | Watabe |
| 5,526,320 A | 6/1996 | Zagar et al. |
| 5,528,062 A | 6/1996 | Hsieh et al. |
| 5,530,581 A | 6/1996 | Cogan |
| 5,530,668 A | 6/1996 | Chern et al. |
| 5,532,618 A | 7/1996 | Hardee et al. |
| 5,539,279 A | 7/1996 | Takeuchi et al. |
| 5,539,779 A | 7/1996 | Nagahori |
| 5,541,871 A | 7/1996 | Nishimura et al. |
| 5,541,872 A | 7/1996 | Lowrey et al. |
| 5,546,344 A | 8/1996 | Fawcett |
| 5,550,770 A | 8/1996 | Kuroda |
| 5,552,638 A | 9/1996 | O'Connor et al. |
| 5,554,305 A | 9/1996 | Wojnarowski et al. |
| 5,554,870 A | 9/1996 | Fitch et al. |
| 5,561,814 A | 10/1996 | Glew et al. |
| 5,562,952 A | 10/1996 | Nakahigashi et al. |
| 5,563,083 A | 10/1996 | Pein |
| 5,572,052 A | 11/1996 | Kashihara et al. |
| 5,572,459 A | 11/1996 | Wilson et al. |
| 5,574,299 A | 11/1996 | Kim |
| 5,585,020 A | 12/1996 | Becker et al. |
| 5,587,609 A | 12/1996 | Murakami et al. |
| 5,589,410 A | 12/1996 | Sato et al. |
| 5,593,912 A | 1/1997 | Rajeevakumar |
| 5,593,926 A | 1/1997 | Fujihira |
| 5,595,606 A | 1/1997 | Fujikawa et al. |
| 5,598,376 A | 1/1997 | Merritt et al. |
| 5,599,396 A | 2/1997 | Sandhu |
| 5,600,587 A | 2/1997 | Koike |
| 5,600,592 A | 2/1997 | Atsumi et al. |
| 5,602,777 A | 2/1997 | Nawaki et al. |
| 5,608,246 A | 3/1997 | Yeager et al. |
| 5,610,864 A | 3/1997 | Manning |
| 5,614,026 A | 3/1997 | Williams |
| 5,616,934 A | 4/1997 | Dennison et al. |
| 5,618,575 A | 4/1997 | Peter |
| 5,618,761 A | 4/1997 | Eguchi et al. |
| 5,619,051 A | 4/1997 | Endo |
| 5,619,159 A | 4/1997 | Sasaki et al. |
| 5,619,642 A | 4/1997 | Nielson et al. |
| 5,621,681 A | 4/1997 | Moon |
| 5,625,233 A | 4/1997 | Cabral, Jr. et al. |
| 5,627,781 A | 5/1997 | Hayashi et al. |
| 5,627,785 A | 5/1997 | Gilliam et al. |
| 5,636,170 A | 6/1997 | Seyyedy |
| 5,637,518 A | 6/1997 | Prall et al. |
| 5,640,342 A | 6/1997 | Gonzalez |
| 5,640,364 A | 6/1997 | Merrit et al. |
| 5,640,507 A | 6/1997 | Lipe |
| 5,644,540 A | 7/1997 | Manning |
| 5,646,583 A | 7/1997 | Seabury et al. |
| 5,646,900 A | 7/1997 | Tsukude et al. |
| 5,651,130 A | 7/1997 | Hinkle et al. |
| 5,652,061 A | 7/1997 | Jeng et al. |
| 5,652,724 A | 7/1997 | Manning |
| 5,656,548 A | 8/1997 | Zavracky et al. |

| | | | | | | |
|---|---|---|---|---|---|---|
| 5,661,695 A | 8/1997 | Zagar et al. | | 5,882,779 A | 3/1999 | Lawandy |
| 5,662,834 A | 9/1997 | Schulz et al. | | 5,885,864 A | 3/1999 | Ma |
| 5,668,773 A | 9/1997 | Zagar et al. | | 5,886,368 A | 3/1999 | Forbes et al. |
| 5,670,790 A | 9/1997 | Katoh et al. | | 5,888,868 A | 3/1999 | Yamazaki et al. |
| 5,673,561 A | 10/1997 | Moss | | 5,891,773 A | 4/1999 | Saitoh |
| 5,674,563 A | 10/1997 | Tarui et al. | | 5,891,797 A | 4/1999 | Farrar |
| 5,674,574 A | 10/1997 | Atwell et al. | | 5,892,249 A | 4/1999 | Courtright et al. |
| 5,675,549 A | 10/1997 | Ong et al. | | 5,897,363 A | 4/1999 | Gonzalez et al. |
| 5,677,867 A | 10/1997 | Hazani | | 5,907,170 A | 5/1999 | Forbes et al. |
| 5,691,209 A | 11/1997 | Liberkowski | | 5,909,618 A | 6/1999 | Forbes et al. |
| 5,691,230 A | 11/1997 | Forbes | | 5,910,684 A | 6/1999 | Sandhu et al. |
| 5,696,008 A | 12/1997 | Tamaki et al. | | 5,910,880 A | 6/1999 | DeBoer et al. |
| 5,698,022 A | 12/1997 | Glassman et al. | | 5,912,313 A | 6/1999 | McIntosh et al. |
| 5,701,666 A | 12/1997 | DeHaven et al. | | 5,912,488 A | 6/1999 | Kim et al. |
| 5,705,415 A | 1/1998 | Orlowski et al. | | 5,912,797 A | 6/1999 | Schneemeyer et al. |
| 5,706,247 A | 1/1998 | Merritt et al. | | 5,916,365 A | 6/1999 | Sherman |
| 5,710,057 A | 1/1998 | Kenney | | 5,923,056 A | 7/1999 | Lee et al. |
| 5,711,812 A | 1/1998 | Chapek et al. | | 5,936,274 A | 8/1999 | Forbes et al. |
| 5,714,336 A | 2/1998 | Simons et al. | | 5,937,295 A | 8/1999 | Chen et al. |
| 5,714,766 A | 2/1998 | Chen et al. | | 5,939,146 A | 8/1999 | Lavernia |
| 5,721,859 A | 2/1998 | Manning | | 5,943,262 A | 8/1999 | Choi |
| 5,726,070 A | 3/1998 | Hong et al. | | 5,945,704 A | 8/1999 | Schrems et al. |
| 5,729,047 A | 3/1998 | Ma | | 5,950,925 A | 9/1999 | Fukunaga et al. |
| 5,729,504 A | 3/1998 | Cowles | | 5,952,039 A | 9/1999 | Hong |
| 5,729,709 A | 3/1998 | Harness | | 5,952,692 A | 9/1999 | Nakazato et al. |
| 5,731,720 A | 3/1998 | Suzuki et al. | | 5,953,626 A | 9/1999 | Hause et al. |
| 5,735,960 A | 4/1998 | Sandhu et al. | | 5,958,140 A | 9/1999 | Arami et al. |
| 5,739,524 A | 4/1998 | Fally | | 5,959,465 A | 9/1999 | Beat |
| 5,739,544 A | 4/1998 | Yuki et al. | | 5,959,896 A | 9/1999 | Forbes |
| 5,739,567 A | 4/1998 | Wong | | 5,962,132 A | 10/1999 | Chang et al. |
| 5,740,104 A | 4/1998 | Forbes | | 5,962,959 A | 10/1999 | Iwasaki et al. |
| 5,744,374 A | 4/1998 | Moon | | 5,963,833 A | 10/1999 | Thakur |
| 5,745,334 A | 4/1998 | Hoffarth et al. | | 5,969,383 A | 10/1999 | Chang et al. |
| 5,745,499 A | 4/1998 | Ong | | 5,972,847 A | 10/1999 | Feenstra et al. |
| 5,747,880 A | 5/1998 | Havemann et al. | | 5,973,352 A | 10/1999 | Noble |
| 5,749,937 A | 5/1998 | Detering et al. | | 5,973,355 A | 10/1999 | Shirai et al. |
| 5,751,021 A | 5/1998 | Teraguchi | | 5,973,356 A | 10/1999 | Noble et al. |
| 5,754,477 A | 5/1998 | Forbes | | 5,981,350 A | 11/1999 | Geusic et al. |
| 5,756,404 A | 5/1998 | Friedenreich et al. | | 5,986,932 A | 11/1999 | Ratnakumar et al. |
| 5,757,044 A | 5/1998 | Kubota | | 5,989,511 A | 11/1999 | Gruen et al. |
| 5,765,214 A | 6/1998 | Sywyk | | 5,989,958 A | 11/1999 | Forbes |
| 5,768,192 A | 6/1998 | Eitan | | 5,990,605 A | 11/1999 | Yoshikawa et al. |
| 5,770,022 A | 6/1998 | Chang et al. | | 5,991,225 A | 11/1999 | Forbes et al. |
| 5,772,153 A | 6/1998 | Abaunza et al. | | 5,994,240 A | 11/1999 | Thakur |
| 5,772,760 A | 6/1998 | Gruen et al. | | 5,994,777 A | 11/1999 | Farrar |
| 5,785,787 A | 7/1998 | Wojnarowski et al. | | 5,998,264 A | 12/1999 | Wu |
| 5,786,630 A | 7/1998 | Bhansali et al. | | 5,998,528 A | 12/1999 | Tsipursky et al. |
| 5,789,030 A | 8/1998 | Rolfson | | 6,005,790 A | 12/1999 | Chan et al. |
| 5,792,269 A | 8/1998 | Deacon et al. | | 6,008,103 A | 12/1999 | Hoepfner |
| 5,795,808 A | 8/1998 | Park | | 6,009,011 A | 12/1999 | Yamauchi |
| 5,798,200 A | 8/1998 | Matsuura et al. | | 6,010,969 A | 1/2000 | Vaartstra |
| 5,798,548 A | 8/1998 | Fujiwara | | 6,013,548 A | 1/2000 | Burns, Jr. et al. |
| 5,801,105 A | 9/1998 | Yano et al. | | 6,013,553 A | 1/2000 | Wallace et al. |
| 5,801,401 A * | 9/1998 | Forbes ............................ 257/77 | | 6,013,566 A | 1/2000 | Thakur et al. |
| 5,804,607 A | 9/1998 | Hedrick et al. | | 6,017,820 A | 1/2000 | Ting et al. |
| 5,810,923 A | 9/1998 | Yano et al. | | 6,018,174 A | 1/2000 | Schrems et al. |
| 5,811,984 A | 9/1998 | Long et al. | | 6,019,848 A | 2/2000 | Frankel et al. |
| 5,821,621 A | 10/1998 | Jeng | | 6,020,024 A | 2/2000 | Maiti et al. |
| 5,822,256 A | 10/1998 | Bauer et al. | | 6,020,243 A | 2/2000 | Wallace et al. |
| 5,827,571 A | 10/1998 | Lee et al. | | 6,022,787 A | 2/2000 | Ma |
| 5,828,080 A | 10/1998 | Yano et al. | | 6,023,124 A | 2/2000 | Chuman et al. |
| 5,828,605 A | 10/1998 | Peng et al. | | 6,023,125 A | 2/2000 | Yoshikawa et al. |
| 5,840,897 A | 11/1998 | Kirlin et al. | | 6,025,034 A | 2/2000 | Strutt et al. |
| 5,841,075 A | 11/1998 | Hanson | | 6,025,225 A | 2/2000 | Forbes et al. |
| 5,844,317 A | 12/1998 | Bertolet et al. | | 6,025,228 A | 2/2000 | Ibok et al. |
| 5,849,628 A | 12/1998 | Sandhu et al. | | 6,025,627 A | 2/2000 | Forbes et al. |
| 5,851,880 A | 12/1998 | Ikegami | | 6,027,960 A | 2/2000 | Kusumoto et al. |
| 5,852,306 A | 12/1998 | Forbes | | 6,027,961 A | 2/2000 | Maiti et al. |
| 5,856,688 A | 1/1999 | Lee et al. | | 6,031,263 A | 2/2000 | Forbes et al. |
| 5,864,923 A | 2/1999 | Rouanet et al. | | 6,034,015 A | 3/2000 | Lin et al. |
| 5,869,369 A | 2/1999 | Hong | | 6,034,389 A | 3/2000 | Burns et al. |
| 5,874,134 A | 2/1999 | Rao et al. | | 6,034,882 A | 3/2000 | Johnson et al. |
| 5,874,760 A | 2/1999 | Burns, Jr. et al. | | 6,037,245 A | 3/2000 | Matsuda |
| 5,878,314 A | 3/1999 | Takaya et al. | | 6,040,218 A | 3/2000 | Lam |
| 5,879,459 A | 3/1999 | Gadgil et al. | | 6,040,243 A | 3/2000 | Li et al. |
| 5,879,787 A | 3/1999 | Petefish | | 6,043,146 A | 3/2000 | Watanabe et al. |
| 5,879,794 A | 3/1999 | Korleski | | 6,044,016 A | 3/2000 | Itoh |
| 5,880,601 A | 3/1999 | Kanazawa et al. | | 6,046,059 A | 4/2000 | Shen et al. |
| 5,880,991 A | 3/1999 | Hsu et al. | | 6,054,349 A * | 4/2000 | Nakajima et al. ............. 438/257 |

| Patent No. | Kind | Date | Inventor |
|---|---|---|---|
| 6,057,271 | A | 5/2000 | Kenjiro et al. |
| 6,059,885 | A | 5/2000 | Ohashi et al. |
| 6,060,743 | A * | 5/2000 | Sugiyama et al. ............ 257/321 |
| 6,060,755 | A | 5/2000 | Ma et al. |
| 6,063,705 | A | 5/2000 | Vaartstra |
| 6,066,869 | A | 5/2000 | Noble et al. |
| 6,066,922 | A | 5/2000 | Iwasaki |
| 6,069,380 | A | 5/2000 | Chou et al. |
| 6,069,816 | A | 5/2000 | Nishimura |
| 6,072,209 | A | 6/2000 | Noble et al. |
| 6,075,383 | A | 6/2000 | Terletzki |
| 6,075,691 | A | 6/2000 | Duenas et al. |
| 6,077,745 | A | 6/2000 | Burns, Jr. et al. |
| 6,077,792 | A | 6/2000 | Farrar |
| RE36,760 | E | 7/2000 | Bloomquist et al. |
| 6,083,793 | A | 7/2000 | Wu |
| 6,087,222 | A | 7/2000 | Jung Lin et al. |
| 6,088,216 | A | 7/2000 | Laibowitz et al. |
| 6,090,636 | A | 7/2000 | Geusic et al. |
| 6,093,623 | A | 7/2000 | Forbes |
| 6,093,944 | A | 7/2000 | VanDover |
| 6,103,419 | A | 8/2000 | Saidi et al. |
| 6,104,061 | A | 8/2000 | Forbes et al. |
| 6,108,240 | A | 8/2000 | Lavi et al. |
| 6,110,529 | A | 8/2000 | Gardiner et al. |
| 6,110,544 | A | 8/2000 | Yang et al. |
| 6,111,285 | A | 8/2000 | Al-Shareef et al. |
| 6,114,252 | A | 9/2000 | Donohoe et al. |
| 6,114,722 | A | 9/2000 | Jan et al. |
| 6,114,725 | A | 9/2000 | Furukawa et al. |
| 6,115,281 | A | 9/2000 | Aggarwal et al. |
| 6,115,401 | A | 9/2000 | Scobey et al. |
| 6,120,531 | A | 9/2000 | Zhou et al. |
| 6,124,729 | A | 9/2000 | Noble et al. |
| 6,125,062 | A | 9/2000 | Ahn et al. |
| 6,127,287 | A | 10/2000 | Hurley et al. |
| 6,129,928 | A | 10/2000 | Sarangapani et al. |
| 6,130,503 | A | 10/2000 | Negishi et al. |
| 6,133,621 | A | 10/2000 | Gaibotti et al. |
| 6,134,175 | A | 10/2000 | Forbes et al. |
| 6,135,175 | A | 10/2000 | Gaudreault et al. |
| 6,137,025 | A | 10/2000 | Ebbinghaus et al. |
| 6,140,181 | A | 10/2000 | Forbes et al. |
| 6,140,200 | A | 10/2000 | Eldridge |
| 6,141,237 | A | 10/2000 | Eliason et al. |
| 6,141,238 | A | 10/2000 | Forbes et al. |
| 6,141,248 | A | 10/2000 | Forbes et al. |
| 6,141,260 | A | 10/2000 | Ahn et al. |
| 6,143,582 | A | 11/2000 | Vu et al. |
| 6,143,616 | A | 11/2000 | Geusic et al. |
| 6,143,631 | A | 11/2000 | Chapek |
| 6,143,636 | A | 11/2000 | Forbes et al. |
| 6,144,155 | A | 11/2000 | Yoshikawa et al. |
| 6,146,959 | A | 11/2000 | DeBoer et al. |
| 6,146,976 | A | 11/2000 | Stecher et al. |
| 6,147,443 | A | 11/2000 | Yoshikawa et al. |
| 6,150,188 | A | 11/2000 | Geusic et al. |
| 6,150,687 | A | 11/2000 | Noble et al. |
| 6,150,724 | A | 11/2000 | Wenzel et al. |
| 6,153,468 | A | 11/2000 | Forbes et al. |
| 6,154,280 | A | 11/2000 | Borden |
| H1924 | H | 12/2000 | Zabinski et al. |
| 6,157,061 | A | 12/2000 | Kawata |
| 6,159,874 | A | 12/2000 | Tews et al. |
| 6,160,739 | A | 12/2000 | Wong |
| 6,161,500 | A | 12/2000 | Kopacz et al. |
| 6,162,712 | A | 12/2000 | Baum et al. |
| 6,163,049 | A | 12/2000 | Bui |
| 6,165,837 | A | 12/2000 | Kawakubo et al. |
| 6,165,890 | A | 12/2000 | Kohl et al. |
| 6,166,401 | A | 12/2000 | Forbes |
| 6,166,487 | A | 12/2000 | Negishi et al. |
| 6,169,306 | B1 | 1/2001 | Gardner et al. |
| 6,171,900 | B1 | 1/2001 | Sun |
| 6,172,305 | B1 | 1/2001 | Tanahashi |
| 6,174,366 | B1 | 1/2001 | Ihantola |
| 6,174,677 | B1 | 1/2001 | Vo-Dinh |
| 6,174,784 | B1 | 1/2001 | Forbes |
| 6,174,809 | B1 | 1/2001 | Kang et al. |
| 6,182,604 | B1 | 2/2001 | Goeckner et al. |
| 6,184,146 | B1 | 2/2001 | Donohoe et al. |
| 6,184,549 | B1 | 2/2001 | Furukawa et al. |
| 6,184,550 | B1 | 2/2001 | Van Buskirk et al. |
| 6,184,612 | B1 | 2/2001 | Negishi et al. |
| 6,185,122 | B1 | 2/2001 | Johnson et al. |
| 6,187,484 | B1 | 2/2001 | Glass et al. |
| 6,191,443 | B1 | 2/2001 | Al-Shareef et al. |
| 6,191,448 | B1 | 2/2001 | Forbes et al. |
| 6,191,459 | B1 | 2/2001 | Hofmann et al. |
| 6,191,470 | B1 | 2/2001 | Forbes et al. |
| 6,194,237 | B1 | 2/2001 | Kim et al. |
| 6,194,262 | B1 | 2/2001 | Noble |
| 6,195,156 | B1 | 2/2001 | Miyamoto et al. |
| 6,198,168 | B1 | 3/2001 | Geusic et al. |
| 6,200,873 | B1 | 3/2001 | Schrems et al. |
| 6,200,893 | B1 | 3/2001 | Sneh |
| 6,203,613 | B1 | 3/2001 | Gates et al. |
| 6,203,726 | B1 | 3/2001 | Danielson et al. |
| 6,204,529 | B1 | 3/2001 | Lung et al. |
| 6,206,972 | B1 | 3/2001 | Dunham |
| 6,207,522 | B1 | 3/2001 | Hunt et al. |
| 6,207,589 | B1 | 3/2001 | Ma et al. |
| 6,208,164 | B1 | 3/2001 | Noble et al. |
| 6,208,881 | B1 | 3/2001 | Champeau |
| 6,210,999 | B1 | 4/2001 | Gardner et al. |
| 6,211,015 | B1 | 4/2001 | Noble |
| 6,211,035 | B1 | 4/2001 | Moise et al. |
| 6,211,039 | B1 | 4/2001 | Noble |
| 6,212,103 | B1 | 4/2001 | Ahrens et al. |
| 6,212,314 | B1 | 4/2001 | Ford |
| 6,214,707 | B1 | 4/2001 | Thakur et al. |
| 6,217,645 | B1 | 4/2001 | Vaartstra |
| 6,218,293 | B1 | 4/2001 | Kraus et al. |
| 6,218,449 | B1 | 4/2001 | Planche et al. |
| 6,219,299 | B1 | 4/2001 | Forbes et al. |
| 6,222,788 | B1 | 4/2001 | Forbes et al. |
| 6,224,690 | B1 | 5/2001 | Andricacos et al. |
| 6,225,163 | B1 | 5/2001 | Bergemont |
| 6,225,168 | B1 | 5/2001 | Gardner et al. |
| 6,225,237 | B1 | 5/2001 | Vaartstra |
| 6,225,599 | B1 | 5/2001 | Namiki |
| 6,229,175 | B1 | 5/2001 | Uchida |
| 6,230,651 | B1 | 5/2001 | Ni et al. |
| 6,232,643 | B1 | 5/2001 | Forbes et al. |
| 6,232,847 | B1 | 5/2001 | Marcy, 5th et al. |
| 6,238,976 | B1 | 5/2001 | Noble et al. |
| 6,243,300 | B1 | 6/2001 | Sunkavalli |
| 6,245,604 | B1 | 6/2001 | Violette et al. |
| 6,245,658 | B1 | 6/2001 | Buynoski |
| 6,246,606 | B1 | 6/2001 | Forbes et al. |
| 6,249,020 | B1 | 6/2001 | Forbes et al. |
| 6,249,460 | B1 | 6/2001 | Forbes et al. |
| 6,252,267 | B1 | 6/2001 | Noble, Jr. |
| 6,252,793 | B1 | 6/2001 | Allen et al. |
| 6,255,712 | B1 | 7/2001 | Clevenger et al. |
| 6,255,852 | B1 | 7/2001 | Forbes et al. |
| 6,258,637 | B1 | 7/2001 | Wilk |
| 6,259,198 | B1 | 7/2001 | Yanagisawa et al. |
| 6,265,279 | B1 | 7/2001 | Radens et al. |
| 6,269,023 | B1 | 7/2001 | Derhacobian et al. |
| 6,270,835 | B1 | 8/2001 | Hunt et al. |
| 6,271,142 | B1 | 8/2001 | Gruening et al. |
| 6,273,951 | B1 | 8/2001 | Vaartstra |
| 6,274,479 | B1 | 8/2001 | Srinivasan |
| 6,274,937 | B1 | 8/2001 | Ahn et al. |
| 6,277,448 | B2 | 8/2001 | Strutt et al. |
| 6,278,230 | B1 | 8/2001 | Yoshizawa et al. |
| 6,281,042 | B1 | 8/2001 | Ahn et al. |
| 6,281,054 | B1 | 8/2001 | Yeo |
| 6,281,144 | B1 | 8/2001 | Cleary et al. |
| 6,282,080 | B1 | 8/2001 | DeBoer et al. |
| 6,285,123 | B1 | 9/2001 | Yamada et al. |
| 6,287,979 | B1 | 9/2001 | Zhou et al. |
| 6,289,842 | B1 | 9/2001 | Tompa |
| 6,290,491 | B1 | 9/2001 | Shahvandi et al. |
| 6,291,314 | B1 | 9/2001 | Henley et al. |
| 6,291,341 | B1 | 9/2001 | Sharan et al. |
| 6,291,364 | B1 | 9/2001 | Gealy et al. |

| | | | | | | |
|---|---|---|---|---|---|---|
| 6,291,866 B1 | 9/2001 | Wallace et al. | | 6,398,923 B1 | 6/2002 | Ireland et al. |
| 6,294,420 B1 | 9/2001 | Tsu et al. | | 6,399,979 B1 | 6/2002 | Noble et al. |
| 6,294,813 B1 | 9/2001 | Forbes et al. | | 6,400,070 B1 | 6/2002 | Yamada et al. |
| 6,296,943 B1 | 10/2001 | Watanabe | | 6,400,552 B2 | 6/2002 | Al-Shareef et al. |
| 6,297,095 B1 | 10/2001 | Muralidhar et al. | | 6,403,414 B2 | 6/2002 | Marsh |
| 6,297,103 B1 | 10/2001 | Ahn et al. | | 6,403,494 B1 | 6/2002 | Chu et al. |
| 6,297,516 B1 | 10/2001 | Forrest et al. | | 6,404,027 B1 | 6/2002 | Hong et al. |
| 6,297,527 B1 | 10/2001 | Agarwal et al. | | 6,404,124 B1 | 6/2002 | Sakemura et al. |
| 6,297,539 B1 | 10/2001 | Ma et al. | | 6,407,424 B2 | 6/2002 | Forbes |
| 6,300,193 B1 | 10/2001 | Forbes | | 6,407,435 B1 | 6/2002 | Ma et al. |
| 6,300,203 B1 | 10/2001 | Buynoski et al. | | 6,413,827 B1 | 7/2002 | Farrar |
| 6,300,255 B1 | 10/2001 | Venkataranan et al. | | 6,414,476 B2 | 7/2002 | Yagi |
| 6,302,964 B1 | 10/2001 | Umotoy et al. | | 6,414,543 B1 | 7/2002 | Beigel et al. |
| 6,303,481 B2 | 10/2001 | Park | | 6,417,537 B1 | 7/2002 | Yang et al. |
| 6,303,500 B1 | 10/2001 | Jiang et al. | | 6,418,050 B2 | 7/2002 | Forbes |
| 6,306,708 B1 | 10/2001 | Peng | | 6,420,230 B1 | 7/2002 | Derderian et al. |
| 6,307,775 B1 | 10/2001 | Forbes et al. | | 6,420,261 B2 | 7/2002 | Kudo |
| 6,310,375 B1 | 10/2001 | Schrems | | 6,420,262 B1 | 7/2002 | Farrar |
| 6,310,376 B1 | 10/2001 | Ueda et al. | | 6,420,279 B1 | 7/2002 | Ono et al. |
| 6,312,999 B1 | 11/2001 | Chivukula et al. | | 6,420,778 B1 | 7/2002 | Sinyansky |
| 6,313,015 B1 | 11/2001 | Lee et al. | | 6,423,613 B1 | 7/2002 | Geusic |
| 6,313,035 B1 | 11/2001 | Sandhu et al. | | 6,423,649 B2 | 7/2002 | Gealy et al. |
| 6,313,046 B1 | 11/2001 | Juengling et al. | | 6,424,001 B1 | 7/2002 | Forbes et al. |
| 6,313,495 B1 | 11/2001 | Shen et al. | | 6,426,292 B2 | 7/2002 | Vaartstra |
| 6,313,518 B1 | 11/2001 | Ahn et al. | | 6,429,065 B1 | 8/2002 | Forbes |
| 6,313,531 B1 | 11/2001 | Geusic et al. | | 6,429,237 B1 | 8/2002 | Tooley |
| 6,316,275 B2 | 11/2001 | Hopfner | | 6,432,779 B1 | 8/2002 | Hobbs et al. |
| 6,316,800 B1 | 11/2001 | Al-Shareef et al. | | 6,433,382 B1 | 8/2002 | Orlowski et al. |
| 6,316,873 B1 | 11/2001 | Ito et al. | | 6,433,408 B1 | 8/2002 | Anjo et al. |
| 6,317,175 B1 | 11/2001 | Salerno et al. | | 6,433,413 B1 | 8/2002 | Farrar |
| 6,317,357 B1 | 11/2001 | Forbes | | 6,433,553 B1 | 8/2002 | Goeckner et al. |
| 6,317,364 B1 | 11/2001 | Guterman et al. | | 6,433,993 B1 | 8/2002 | Hunt et al. |
| 6,320,091 B1 | 11/2001 | Ebbinghaus et al. | | 6,434,041 B2 | 8/2002 | Forbes et al. |
| 6,323,081 B1 | 11/2001 | Marsh | | 6,436,203 B1 | 8/2002 | Kaizuka et al. |
| 6,323,511 B1 | 11/2001 | Marsh | | 6,436,749 B1 | 8/2002 | Tonti et al. |
| 6,323,844 B1 | 11/2001 | Yeh et al. | | 6,437,381 B1 | 8/2002 | Gruening et al. |
| 6,329,286 B1 | 12/2001 | Vaartstra | | 6,437,389 B1 | 8/2002 | Forbes et al. |
| 6,331,282 B1 | 12/2001 | Manthiram et al. | | 6,438,031 B1 | 8/2002 | Fastow |
| 6,331,465 B1 | 12/2001 | Forbes et al. | | 6,440,801 B1 | 8/2002 | Furukawa et al. |
| 6,333,556 B1 | 12/2001 | Juengling et al. | | 6,441,417 B1 | 8/2002 | Zhang et al. |
| 6,335,536 B1 | 1/2002 | Goeckner et al. | | 6,441,421 B1 | 8/2002 | Clevenger et al. |
| 6,335,554 B1 | 1/2002 | Yoshikawa | | 6,444,039 B1 | 9/2002 | Nguyen |
| 6,337,805 B1 | 1/2002 | Forbes et al. | | 6,444,042 B1 | 9/2002 | Yang et al. |
| 6,341,084 B2 | 1/2002 | Numata et al. | | 6,444,592 B1 | 9/2002 | Ballantine et al. |
| 6,342,445 B1 | 1/2002 | Marsh | | 6,444,895 B1 | 9/2002 | Nikawa |
| 6,342,454 B1 | 1/2002 | Hawker et al. | | 6,445,023 B1 | 9/2002 | Vaartstra et al. |
| 6,344,403 B1 | 2/2002 | Madhukar et al. | | 6,445,030 B1 | 9/2002 | Wu et al. |
| 6,346,477 B1 | 2/2002 | Kaloyeros et al. | | 6,447,764 B1 | 9/2002 | Bayer et al. |
| 6,347,749 B1 | 2/2002 | Moore et al. | | 6,447,848 B1 | 9/2002 | Chow et al. |
| 6,348,386 B1 | 2/2002 | Gilmer | | 6,448,192 B1 | 9/2002 | Kaushik |
| 6,348,709 B1 | 2/2002 | Graettinger et al. | | 6,448,601 B1 | 9/2002 | Forbes et al. |
| 6,350,649 B1 | 2/2002 | Jeong et al. | | 6,449,188 B1 | 9/2002 | Fastow |
| 6,350,672 B1 | 2/2002 | Sun | | 6,451,641 B1 | 9/2002 | Halliyal et al. |
| 6,350,704 B1 | 2/2002 | Ahn et al. | | 6,451,662 B1 | 9/2002 | Chudzik et al. |
| 6,351,411 B2 | 2/2002 | Forbes et al. | | 6,451,695 B2 | 9/2002 | Sneh |
| 6,352,591 B1 | 3/2002 | Yieh et al. | | 6,452,229 B1 | 9/2002 | Krivokapic |
| 6,352,818 B1 | 3/2002 | Hsieh | | 6,452,759 B2 | 9/2002 | Urai |
| 6,353,554 B1 | 3/2002 | Banks | | 6,454,912 B1 | 9/2002 | Ahn et al. |
| 6,355,561 B1 | 3/2002 | Sandhu et al. | | 6,455,717 B1 | 9/2002 | Vaartstra |
| 6,359,310 B1 | 3/2002 | Gonzalez et al. | | 6,456,531 B1 | 9/2002 | Wang et al. |
| 6,365,470 B1 | 4/2002 | Maeda | | 6,456,535 B2 | 9/2002 | Forbes et al. |
| 6,365,519 B2 | 4/2002 | Kraus et al. | | 6,456,536 B1 | 9/2002 | Sobek et al. |
| 6,368,398 B2 | 4/2002 | Vaartstra | | 6,458,431 B2 | 10/2002 | Hill et al. |
| 6,368,518 B1 | 4/2002 | Vaartstra | | 6,458,645 B2 | 10/2002 | DeBoer et al. |
| 6,368,941 B1 | 4/2002 | Chen et al. | | 6,458,701 B1 | 10/2002 | Chae et al. |
| 6,372,567 B1 | 4/2002 | Tews et al. | | 6,459,618 B1 | 10/2002 | Wang |
| 6,373,740 B1 | 4/2002 | Forbes et al. | | 6,461,436 B1 | 10/2002 | Campbell et al. |
| 6,377,070 B1 | 4/2002 | Forbes | | 6,461,905 B1 | 10/2002 | Wang et al. |
| 6,380,294 B1 | 4/2002 | Babinec et al. | | 6,461,914 B1 | 10/2002 | Roberts et al. |
| 6,380,579 B1 | 4/2002 | Nam et al. | | 6,461,931 B1 | 10/2002 | Eldridge |
| 6,380,765 B1 | 4/2002 | Forbes et al. | | 6,461,970 B1 | 10/2002 | Yin |
| 6,381,124 B1 | 4/2002 | Whitcher et al. | | 6,465,298 B2 | 10/2002 | Forbes et al. |
| 6,381,168 B2 | 4/2002 | Forbes | | 6,465,334 B1 | 10/2002 | Buynoski et al. |
| 6,387,712 B1 | 5/2002 | Yano et al. | | 6,465,370 B1 | 10/2002 | Schrems et al. |
| 6,388,376 B1 | 5/2002 | Negishi et al. | | 6,465,853 B1 | 10/2002 | Hobbs et al. |
| 6,391,769 B1 | 5/2002 | Lee et al. | | 6,472,302 B1 | 10/2002 | Lee |
| 6,392,257 B1 | 5/2002 | Ramdani et al. | | 6,472,321 B2 | 10/2002 | Srinivasan et al. |
| 6,395,650 B1 | 5/2002 | Callegari et al. | | 6,472,632 B1 | 10/2002 | Peterson et al. |
| 6,396,099 B2 | 5/2002 | Joo et al. | | 6,472,702 B1 | 10/2002 | Shen |

| Patent | Type | Date | Inventor |
|---|---|---|---|
| 6,472,803 | B1 | 10/2002 | Yoshizawa et al. |
| 6,475,857 | B1 | 11/2002 | Kim et al. |
| 6,475,859 | B1 | 11/2002 | Tews et al. |
| 6,476,434 | B1 | 11/2002 | Noble et al. |
| 6,482,740 | B2 | 11/2002 | Soininen et al. |
| 6,486,027 | B1 | 11/2002 | Noble et al. |
| 6,486,703 | B2 | 11/2002 | Noble et al. |
| 6,487,121 | B1 | 11/2002 | Thurgate et al. |
| 6,489,648 | B2 | 12/2002 | Iwasaki et al. |
| 6,492,233 | B2 | 12/2002 | Forbes et al. |
| 6,492,241 | B1 | 12/2002 | Rhodes et al. |
| 6,492,288 | B2 | 12/2002 | Shindo |
| 6,495,436 | B2 | 12/2002 | Ahn et al. |
| 6,495,458 | B2 | 12/2002 | Marsh |
| 6,496,034 | B2 | 12/2002 | Forbes et al. |
| 6,498,063 | B1 | 12/2002 | Ping |
| 6,498,065 | B1 | 12/2002 | Forbes et al. |
| 6,498,362 | B1 | 12/2002 | Forbes et al. |
| 6,500,496 | B1 | 12/2002 | Goeckner et al. |
| 6,503,818 | B1 | 1/2003 | Jang |
| 6,504,207 | B1 | 1/2003 | Chen et al. |
| 6,504,214 | B1 | 1/2003 | Yu et al. |
| 6,504,755 | B1 | 1/2003 | Katayama et al. |
| 6,506,666 | B2 | 1/2003 | Marsh |
| 6,509,234 | B1 | 1/2003 | Krivokapic |
| 6,509,280 | B2 | 1/2003 | Choi |
| 6,509,599 | B1 | 1/2003 | Wurster et al. |
| 6,511,873 | B2 | 1/2003 | Ballantine et al. |
| 6,511,905 | B1 | 1/2003 | Lee et al. |
| 6,514,348 | B2 | 2/2003 | Miyamoto |
| 6,514,820 | B2 | 2/2003 | Ahn et al. |
| 6,514,828 | B2 | 2/2003 | Ahn et al. |
| 6,514,842 | B1 | 2/2003 | Prall et al. |
| 6,515,510 | B2 | 2/2003 | Noble et al. |
| 6,518,121 | B2 | 2/2003 | Al-Shareef et al. |
| 6,518,610 | B2 | 2/2003 | Yang et al. |
| 6,518,615 | B1 | 2/2003 | Geusic et al. |
| 6,518,634 | B1 | 2/2003 | Kaushik et al. |
| 6,521,911 | B2 | 2/2003 | Parsons et al. |
| 6,521,943 | B1 | 2/2003 | Mine et al. |
| 6,521,950 | B1 | 2/2003 | Shimabukuro et al. |
| 6,521,956 | B1 | 2/2003 | Lee |
| 6,521,958 | B1 | 2/2003 | Forbes et al. |
| 6,524,867 | B2 | 2/2003 | Yang et al. |
| 6,524,901 | B1 | 2/2003 | Trivedi |
| 6,526,191 | B1 | 2/2003 | Geusic et al. |
| 6,527,866 | B1 | 3/2003 | Matijasevic et al. |
| 6,527,918 | B2 | 3/2003 | Goeckner et al. |
| 6,528,858 | B1 | 3/2003 | Yu et al. |
| 6,531,324 | B2 | 3/2003 | Hsu et al. |
| 6,531,354 | B2 | 3/2003 | Maria et al. |
| 6,531,727 | B2 | 3/2003 | Forbes et al. |
| 6,533,867 | B2 | 3/2003 | Doppelhammer |
| 6,534,357 | B1 | 3/2003 | Basceri |
| 6,534,420 | B2 | 3/2003 | Ahn et al. |
| 6,537,613 | B1 | 3/2003 | Senzaki et al. |
| 6,538,330 | B1 | 3/2003 | Forbes |
| 6,541,079 | B1 | 4/2003 | Bojarczuk, Jr. et al. |
| 6,541,280 | B2 | 4/2003 | Kaushik et al. |
| 6,541,353 | B1 | 4/2003 | Sandhu et al. |
| 6,542,229 | B1 | 4/2003 | Kalal et al. |
| 6,544,846 | B2 | 4/2003 | Ahn et al. |
| 6,544,875 | B1 | 4/2003 | Wilk |
| 6,544,888 | B2 | 4/2003 | Lee |
| 6,545,314 | B2 * | 4/2003 | Forbes et al. ............ 257/325 |
| 6,545,338 | B1 | 4/2003 | Bothra et al. |
| 6,551,893 | B1 | 4/2003 | Zheng et al. |
| 6,551,929 | B1 | 4/2003 | Kori et al. |
| 6,552,383 | B2 | 4/2003 | Ahn et al. |
| 6,552,387 | B1 | 4/2003 | Eitan |
| 6,552,388 | B2 | 4/2003 | Wilk et al. |
| 6,552,952 | B2 | 4/2003 | Pascucci |
| 6,555,858 | B1 | 4/2003 | Jones et al. |
| 6,555,879 | B1 | 4/2003 | Krivokapic et al. |
| 6,559,014 | B1 | 5/2003 | Jeon |
| 6,559,472 | B2 | 5/2003 | Sandhu et al. |
| 6,559,491 | B2 | 5/2003 | Forbes et al. |
| 6,562,491 | B1 | 5/2003 | Jeon |
| 6,563,160 | B2 | 5/2003 | Clevenger et al. |
| 6,566,147 | B2 | 5/2003 | Basceri et al. |
| 6,566,682 | B2 | 5/2003 | Forbes |
| 6,567,303 | B1 | 5/2003 | Hamilton et al. |
| 6,567,312 | B1 | 5/2003 | Torii et al. |
| 6,569,757 | B1 | 5/2003 | Weling et al. |
| 6,570,248 | B1 | 5/2003 | Ahn et al. |
| 6,570,787 | B1 | 5/2003 | Wang et al. |
| 6,572,836 | B1 | 6/2003 | Schulz et al. |
| 6,573,199 | B2 | 6/2003 | Sandhu et al. |
| 6,574,143 | B2 | 6/2003 | Nakazato |
| 6,574,144 | B2 | 6/2003 | Forbes |
| 6,574,968 | B1 | 6/2003 | Symko et al. |
| 6,580,124 | B1 | 6/2003 | Cleeves et al. |
| 6,586,349 | B1 | 7/2003 | Jeon et al. |
| 6,586,785 | B2 * | 7/2003 | Flagan et al. ............ 257/261 |
| 6,586,792 | B2 | 7/2003 | Ahn et al. |
| 6,586,797 | B2 | 7/2003 | Forbes et al. |
| 6,587,408 | B1 | 7/2003 | Jacobson et al. |
| 6,590,252 | B2 | 7/2003 | Kutsunai et al. |
| 6,592,661 | B1 | 7/2003 | Thakur et al. |
| 6,592,839 | B2 | 7/2003 | Gruen et al. |
| 6,592,942 | B1 | 7/2003 | Van Wijck |
| 6,593,610 | B2 | 7/2003 | Gonzalez |
| 6,596,583 | B2 | 7/2003 | Agarwal et al. |
| 6,596,617 | B1 | 7/2003 | King et al. |
| 6,596,636 | B2 | 7/2003 | Sandhu et al. |
| 6,596,651 | B2 | 7/2003 | Gealy et al. |
| 6,597,037 | B1 | 7/2003 | Forbes et al. |
| 6,600,339 | B2 | 7/2003 | Forbes et al. |
| 6,602,053 | B2 | 8/2003 | Subramanian et al. |
| 6,602,338 | B2 | 8/2003 | Chen et al. |
| 6,602,720 | B2 | 8/2003 | Hsu et al. |
| 6,603,080 | B2 | 8/2003 | Jensen |
| 6,608,378 | B2 | 8/2003 | Ahn et al. |
| 6,613,656 | B2 | 9/2003 | Li |
| 6,613,695 | B2 | 9/2003 | Pomarede et al. |
| 6,613,702 | B2 | 9/2003 | Sandhu et al. |
| 6,614,092 | B2 | 9/2003 | Eldridge et al. |
| 6,617,634 | B2 | 9/2003 | Marsh et al. |
| 6,617,639 | B1 | 9/2003 | Wang et al. |
| 6,620,670 | B2 | 9/2003 | Song et al. |
| 6,620,752 | B2 | 9/2003 | Messing et al. |
| 6,627,260 | B2 | 9/2003 | Derderian et al. |
| 6,627,503 | B2 | 9/2003 | Ma et al. |
| 6,627,508 | B1 | 9/2003 | DeBoer et al. |
| 6,628,355 | B1 | 9/2003 | Takahara |
| 6,630,383 | B1 | 10/2003 | Ibok et al. |
| 6,630,713 | B2 | 10/2003 | Geusic |
| 6,632,279 | B1 | 10/2003 | Ritala et al. |
| 6,638,575 | B1 | 10/2003 | Chen et al. |
| 6,638,810 | B2 | 10/2003 | Bakli et al. |
| 6,638,859 | B2 | 10/2003 | Sneh et al. |
| 6,639,267 | B2 | 10/2003 | Eldridge |
| 6,639,268 | B2 | 10/2003 | Forbes et al. |
| 6,641,887 | B2 | 11/2003 | Lida et al. |
| 6,642,567 | B1 | 11/2003 | Marsh |
| 6,642,573 | B1 | 11/2003 | Halliyal et al. |
| 6,642,782 | B2 | 11/2003 | Beigel et al. |
| 6,645,569 | B2 | 11/2003 | Cramer et al. |
| 6,645,882 | B1 | 11/2003 | Halliyal et al. |
| 6,646,307 | B1 | 11/2003 | Yu et al. |
| 6,652,924 | B2 | 11/2003 | Sherman |
| 6,653,209 | B1 | 11/2003 | Yamagata |
| 6,653,591 | B1 | 11/2003 | Peterson et al. |
| 6,656,371 | B2 | 12/2003 | Drewes |
| 6,656,764 | B1 | 12/2003 | Wang et al. |
| 6,656,792 | B2 * | 12/2003 | Choi et al. ............ 438/257 |
| 6,656,835 | B2 | 12/2003 | Marsh et al. |
| 6,660,578 | B1 | 12/2003 | Karlsson et al. |
| 6,660,631 | B1 | 12/2003 | Marsh |
| 6,660,660 | B2 | 12/2003 | Haukka et al. |
| 6,661,058 | B2 | 12/2003 | Ahn et al. |
| 6,664,154 | B1 | 12/2003 | Bell et al. |
| 6,664,806 | B2 | 12/2003 | Forbes et al. |
| 6,669,823 | B1 | 12/2003 | Sarkas et al. |
| 6,669,996 | B2 | 12/2003 | Ueno et al. |
| 6,670,284 | B2 | 12/2003 | Yin |
| 6,670,719 | B2 | 12/2003 | Eldridge et al. |
| 6,673,701 | B1 | 1/2004 | Marsh et al. |

| | | |
|---|---|---|
| 6,674,138 B1 | 1/2004 | Halliyal et al. |
| 6,674,167 B1 | 1/2004 | Ahn et al. |
| 6,676,595 B1 | 1/2004 | Delfino |
| 6,677,204 B2 | 1/2004 | Cleeves et al. |
| 6,677,250 B2 | 1/2004 | Carpenter et al. |
| 6,677,640 B1 | 1/2004 | Sandhu et al. |
| 6,679,315 B2 | 1/2004 | Cosley et al. |
| 6,680,508 B1 | 1/2004 | Rudeck |
| 6,682,602 B2 | 1/2004 | Vaartstra |
| 6,682,969 B1 | 1/2004 | Basceri et al. |
| 6,683,005 B2 | 1/2004 | Sandhu et al. |
| 6,683,011 B2 | 1/2004 | Smith et al. |
| 6,686,212 B1 | 2/2004 | Conley, Jr. et al. |
| 6,686,654 B2 | 2/2004 | Farrar et al. |
| 6,689,192 B1 | 2/2004 | Phillips et al. |
| 6,689,657 B2 | 2/2004 | Gealy et al. |
| 6,689,660 B1 | 2/2004 | Noble et al. |
| 6,690,055 B1 | 2/2004 | Uhlenbrock et al. |
| 6,692,898 B2 | 2/2004 | Ning |
| 6,696,332 B2 | 2/2004 | Visokay et al. |
| 6,696,724 B2 | 2/2004 | Verhaar |
| 6,699,745 B1 | 3/2004 | Banerjee et al. |
| 6,699,747 B2 | 3/2004 | Ruff et al. |
| 6,700,132 B2 | 3/2004 | Chuman et al. |
| 6,703,279 B2 | 3/2004 | Lee |
| 6,706,115 B2 | 3/2004 | Leskela et al. |
| 6,709,912 B1 | 3/2004 | Ang et al. |
| 6,709,968 B1 | 3/2004 | Eldridge et al. |
| 6,709,978 B2 | 3/2004 | Geusic et al. |
| 6,709,989 B2 | 3/2004 | Ramdani et al. |
| 6,710,538 B1 | 3/2004 | Ahn et al. |
| 6,713,162 B2 | 3/2004 | Takaya et al. |
| 6,713,329 B1 | 3/2004 | Wagner et al. |
| 6,713,812 B1 | 3/2004 | Hoefler et al. |
| 6,713,846 B1 | 3/2004 | Senzaki |
| 6,714,455 B2 | 3/2004 | Banks |
| 6,717,211 B2 | 4/2004 | Gonzalez et al. |
| 6,720,216 B2 | 4/2004 | Forbes |
| 6,720,221 B1 | 4/2004 | Ahn et al. |
| 6,723,577 B1 | 4/2004 | Geusic et al. |
| 6,723,606 B2 | 4/2004 | Flagan et al. |
| 6,725,670 B2 | 4/2004 | Smith et al. |
| 6,727,105 B1 | 4/2004 | Brug et al. |
| 6,727,169 B1 | 4/2004 | Soininen et al. |
| 6,728,092 B2 | 4/2004 | Hunt et al. |
| 6,730,163 B2 | 5/2004 | Vaartstra |
| 6,730,164 B2 | 5/2004 | Vaartstra et al. |
| 6,730,367 B2 | 5/2004 | Sandhu |
| 6,730,575 B2 | 5/2004 | Eldridge |
| 6,731,531 B1 | 5/2004 | Forbes et al. |
| 6,734,480 B2 | 5/2004 | Chung et al. |
| 6,734,510 B2 | 5/2004 | Forbes et al. |
| 6,737,740 B2 | 5/2004 | Forbes et al. |
| 6,737,887 B2 | 5/2004 | Forbes et al. |
| 6,740,605 B1 | 5/2004 | Shiraiwa et al. |
| 6,740,928 B2 | 5/2004 | Yoshii et al. |
| 6,744,063 B2 | 6/2004 | Yoshikawa et al. |
| 6,744,093 B2 | 6/2004 | Agarwal et al. |
| 6,746,893 B1 | 6/2004 | Forbes et al. |
| 6,746,916 B2 | 6/2004 | Agarwal et al. |
| 6,746,930 B2 | 6/2004 | Yang et al. |
| 6,746,934 B2 | 6/2004 | Sandhu et al. |
| 6,747,347 B2 | 6/2004 | Farrar et al. |
| 6,750,066 B1 | 6/2004 | Cheung et al. |
| 6,750,126 B1 | 6/2004 | Visokay et al. |
| 6,753,567 B2 | 6/2004 | Maria et al. |
| 6,753,568 B1 | 6/2004 | Nakazato et al. |
| 6,754,108 B2 | 6/2004 | Forbes |
| 6,755,886 B2 | 6/2004 | Phillips et al. |
| 6,756,237 B2 | 6/2004 | Xiao et al. |
| 6,756,292 B2 | 6/2004 | Lee et al. |
| 6,756,298 B2 | 6/2004 | Ahn et al. |
| 6,756,567 B1 | 6/2004 | Suen |
| 6,759,081 B2 | 7/2004 | Huganen et al. |
| 6,759,151 B1 | 7/2004 | Lee |
| 6,760,257 B2 | 7/2004 | Huang et al. |
| 6,762,114 B1 | 7/2004 | Chambers |
| 6,764,901 B2 | 7/2004 | Noble |
| 6,764,919 B2 | 7/2004 | Yu et al. |
| 6,764,941 B2 | 7/2004 | Yang et al. |
| 6,767,419 B2 | 7/2004 | Branagan |
| 6,767,582 B1 | 7/2004 | Elers |
| 6,767,749 B2 | 7/2004 | Kub et al. |
| 6,767,795 B2 | 7/2004 | Ahn et al. |
| 6,768,175 B1 | 7/2004 | Morishita et al. |
| 6,770,536 B2 | 8/2004 | Wilk et al. |
| 6,770,923 B2 | 8/2004 | Nguyen et al. |
| 6,770,954 B2 | 8/2004 | Lee |
| 6,773,981 B1 | 8/2004 | Al-Shareef et al. |
| 6,773,984 B2 | 8/2004 | Srividya et al. |
| 6,774,050 B2 | 8/2004 | Ahn et al. |
| 6,774,061 B2 * | 8/2004 | Coffa et al. .................. 438/197 |
| 6,777,353 B2 | 8/2004 | Putkonen |
| 6,777,715 B1 | 8/2004 | Geusic et al. |
| 6,777,739 B2 | 8/2004 | Agarwal et al. |
| 6,778,441 B2 | 8/2004 | Forbes et al. |
| 6,780,704 B1 | 8/2004 | Raaijmakers et al. |
| 6,784,045 B1 | 8/2004 | Price et al. |
| 6,784,101 B1 | 8/2004 | Yu et al. |
| 6,784,508 B2 | 8/2004 | Tanaka et al. |
| 6,785,120 B1 | 8/2004 | Basceri et al. |
| 6,787,122 B2 | 9/2004 | Zhou |
| 6,787,370 B2 | 9/2004 | Forbes et al. |
| 6,787,413 B2 | 9/2004 | Ahn |
| 6,787,463 B2 | 9/2004 | Mardian et al. |
| 6,787,888 B2 | 9/2004 | Forbes et al. |
| 6,787,906 B1 | 9/2004 | Yang et al. |
| 6,787,992 B2 | 9/2004 | Chuman et al. |
| 6,790,755 B2 | 9/2004 | Jeon |
| 6,790,791 B2 | 9/2004 | Ahn et al. |
| 6,794,255 B1 | 9/2004 | Forbes et al. |
| 6,794,315 B1 | 9/2004 | Klemperer et al. |
| 6,794,709 B2 | 9/2004 | Ahn et al. |
| 6,794,735 B2 | 9/2004 | Forbes et al. |
| 6,797,561 B2 | 9/2004 | Ko et al. |
| 6,800,567 B2 | 10/2004 | Cho |
| 6,801,415 B2 | 10/2004 | Slaughter et al. |
| 6,803,275 B2 | 10/2004 | Park et al. |
| 6,803,311 B2 | 10/2004 | Choi |
| 6,803,326 B2 | 10/2004 | Ahn et al. |
| 6,804,136 B2 | 10/2004 | Forbes |
| 6,806,187 B2 | 10/2004 | Graettinger et al. |
| 6,806,211 B2 | 10/2004 | Shinriki et al. |
| 6,808,978 B2 | 10/2004 | Kim |
| 6,808,983 B2 | 10/2004 | Hill |
| 6,812,100 B2 | 11/2004 | Ahn et al. |
| 6,812,110 B2 | 11/2004 | Basceri et al. |
| 6,812,137 B2 | 11/2004 | Forbes et al. |
| 6,812,157 B1 | 11/2004 | Gadgil |
| 6,812,513 B2 | 11/2004 | Geusic et al. |
| 6,812,516 B2 | 11/2004 | Noble et al. |
| 6,815,781 B2 | 11/2004 | Vyvoda et al. |
| 6,815,804 B2 | 11/2004 | Forbes |
| 6,818,067 B2 | 11/2004 | Doering et al. |
| 6,818,937 B2 | 11/2004 | Noble et al. |
| 6,821,563 B2 | 11/2004 | Yudovsky |
| 6,821,862 B2 | 11/2004 | Cho |
| 6,821,873 B2 | 11/2004 | Visokay et al. |
| 6,828,045 B1 | 12/2004 | Tokailin et al. |
| 6,828,191 B1 | 12/2004 | Wurster et al. |
| 6,828,632 B2 | 12/2004 | Bhattacharyya |
| 6,828,656 B2 | 12/2004 | Forbes et al. |
| 6,830,676 B2 | 12/2004 | Deevi |
| 6,831,310 B1 | 12/2004 | Mathew et al. |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,833,317 B2 | 12/2004 | Forbes et al. |
| 6,835,111 B2 | 12/2004 | Ahn et al. |
| 6,838,404 B2 | 1/2005 | Hentges et al. |
| 6,839,280 B1 | 1/2005 | Chindalore et al. |
| 6,842,370 B2 | 1/2005 | Forbes |
| 6,844,203 B2 | 1/2005 | Ahn et al. |
| 6,844,256 B2 | 1/2005 | Forbes et al. |
| 6,844,260 B2 | 1/2005 | Sarigiannis et al. |
| 6,844,319 B1 | 1/2005 | Poelstra et al. |
| 6,844,604 B2 | 1/2005 | Lee et al. |
| 6,846,574 B2 | 1/2005 | Subramanian |

| Patent No. | Date | Inventor |
|---|---|---|
| 6,846,738 B2 | 1/2005 | Forbes et al. |
| 6,849,948 B2 | 2/2005 | Chen et al. |
| 6,852,167 B2 | 2/2005 | Ahn |
| 6,852,613 B2 | 2/2005 | Forbes et al. |
| 6,852,645 B2 | 2/2005 | Colombo et al. |
| 6,853,587 B2 | 2/2005 | Forbes |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,858,894 B2 | 2/2005 | Srividya et al. |
| 6,859,093 B1 | 2/2005 | Beigel |
| 6,863,727 B1 | 3/2005 | Elers et al. |
| 6,863,933 B2 | 3/2005 | Cramer et al. |
| 6,864,191 B2 | 3/2005 | Yoon |
| 6,864,527 B2 | 3/2005 | DeBoer et al. |
| 6,867,097 B1 | 3/2005 | Ramsbey et al. |
| 6,869,877 B2 | 3/2005 | Rhodes et al. |
| 6,873,539 B1 | 3/2005 | Fazan et al. |
| 6,878,602 B2 | 4/2005 | Basceri et al. |
| 6,878,624 B1 | 4/2005 | Bruley et al. |
| 6,881,994 B2 | 4/2005 | Lee et al. |
| 6,884,706 B2 | 4/2005 | Forbes et al. |
| 6,884,719 B2 | 4/2005 | Chang et al. |
| 6,884,739 B2 | 4/2005 | Ahn et al. |
| 6,887,758 B2 | 5/2005 | Chindalore et al. |
| 6,888,739 B2 | 5/2005 | Forbes |
| 6,890,843 B2 | 5/2005 | Forbes et al. |
| 6,893,984 B2 | 5/2005 | Ahn et al. |
| 6,894,944 B2 | 5/2005 | Ishibashi et al. |
| 6,896,617 B2 | 5/2005 | Daly |
| 6,900,116 B2 | 5/2005 | Forbes et al. |
| 6,900,122 B2 | 5/2005 | Ahn et al. |
| 6,900,481 B2 | 5/2005 | Jin et al. |
| 6,903,003 B2 | 6/2005 | Forbes et al. |
| 6,903,367 B2 | 6/2005 | Forbes |
| 6,903,444 B2 | 6/2005 | Forbes et al. |
| 6,905,994 B2 | 6/2005 | Ohsato et al. |
| 6,906,402 B2 | 6/2005 | Forbes et al. |
| 6,906,953 B2 | 6/2005 | Forbes |
| 6,912,158 B2 | 6/2005 | Forbes |
| 6,914,278 B2 | 7/2005 | Forbes et al. |
| 6,914,800 B2 | 7/2005 | Ahn et al. |
| 6,916,668 B2 | 7/2005 | Spielberger et al. |
| 6,917,112 B2 | 7/2005 | Basceri et al. |
| 6,919,266 B2 | 7/2005 | Ahn et al. |
| 6,921,702 B2 | 7/2005 | Ahn et al. |
| 6,929,830 B2 | 8/2005 | Tei et al. |
| 6,930,059 B2 | 8/2005 | Conley, Jr. et al. |
| 6,930,346 B2 | 8/2005 | Ahn et al. |
| 6,933,225 B2 | 8/2005 | Werkhoven et al. |
| 6,949,433 B1 | 9/2005 | Hidehiko et al. |
| 6,950,340 B2 | 9/2005 | Bhattacharyya |
| 6,952,032 B2 | 10/2005 | Forbes et al. |
| 6,953,730 B2 | 10/2005 | Ahn et al. |
| 6,955,968 B2 | 10/2005 | Forbes et al. |
| 6,958,265 B2 * | 10/2005 | Steimle et al. ............ 438/211 |
| 6,958,302 B2 | 10/2005 | Ahn et al. |
| 6,958,937 B2 | 10/2005 | Forbes et al. |
| 6,960,538 B2 | 11/2005 | Ahn et al. |
| 6,963,103 B2 | 11/2005 | Forbes |
| 6,970,053 B2 | 11/2005 | Akram et al. |
| 6,979,855 B2 | 12/2005 | Ahn et al. |
| 6,982,230 B2 | 1/2006 | Cabral, Jr. et al. |
| 6,984,591 B1 | 1/2006 | Buchanan et al. |
| 6,989,565 B1 | 1/2006 | Aronowitz et al. |
| 6,989,573 B2 | 1/2006 | Ahn et al. |
| 6,991,984 B2 * | 1/2006 | Ingersoll et al. ............ 438/257 |
| 5,274,249 A1 | 2/2006 | Xi, et al. |
| 6,995,057 B2 | 2/2006 | Forbes et al. |
| 6,995,437 B1 | 2/2006 | Kinoshita et al. |
| 6,996,009 B2 | 2/2006 | Forbes |
| 7,005,391 B2 | 2/2006 | Min et al. |
| 7,005,697 B2 * | 2/2006 | Batra et al. ............ 257/315 |
| 7,012,297 B2 | 3/2006 | Bhattacharyya |
| 7,012,311 B2 | 3/2006 | Ohmi et al. |
| 7,015,525 B2 | 3/2006 | Forbes et al. |
| 7,018,868 B1 | 3/2006 | Yang et al. |
| 7,019,351 B2 | 3/2006 | Eppich et al. |
| 7,025,894 B2 | 4/2006 | Hess et al. |
| 7,026,694 B2 | 4/2006 | Ahn et al. |
| 7,037,574 B2 | 5/2006 | Paranjpe et al. |
| 7,037,862 B2 | 5/2006 | Ahn et al. |
| 7,041,530 B2 * | 5/2006 | Nunoshita et al. ............ 438/99 |
| 7,042,043 B2 | 5/2006 | Forbes et al. |
| 7,045,406 B2 | 5/2006 | Huotari et al. |
| 7,045,430 B2 | 5/2006 | Ahn et al. |
| 7,049,192 B2 | 5/2006 | Ahn et al. |
| 7,057,244 B2 | 6/2006 | Andreoni et al. |
| 7,064,048 B2 | 6/2006 | Lai et al. |
| 7,064,058 B2 | 6/2006 | Ahn et al. |
| 7,067,840 B2 | 6/2006 | Klauk et al. |
| 7,068,544 B2 | 6/2006 | Forbes et al. |
| 7,071,066 B2 | 7/2006 | Wang et al. |
| 7,074,380 B2 | 7/2006 | Iwaki et al. |
| 7,074,673 B2 | 7/2006 | Forbes |
| 7,075,829 B2 | 7/2006 | Forbes |
| 7,081,421 B2 | 7/2006 | Ahn et al. |
| 7,084,078 B2 | 8/2006 | Ahn et al. |
| 7,087,954 B2 | 8/2006 | Forbes |
| 7,101,770 B2 | 9/2006 | Forbes |
| 7,101,778 B2 | 9/2006 | Forbes et al. |
| 7,101,813 B2 | 9/2006 | Ahn et al. |
| 7,109,079 B2 | 9/2006 | Schaeffer, III et al. |
| 7,112,841 B2 | 9/2006 | Eldridge et al. |
| 7,122,414 B2 | 10/2006 | Huotari |
| 7,122,415 B2 | 10/2006 | Jang et al. |
| 7,122,464 B2 | 10/2006 | Vaartstra |
| 7,129,553 B2 | 10/2006 | Ahn et al. |
| 7,132,329 B1 | 11/2006 | Hong et al. |
| 7,135,369 B2 | 11/2006 | Ahn et al. |
| 7,135,421 B2 | 11/2006 | Ahn et al. |
| 7,135,734 B2 | 11/2006 | Eldridge et al. |
| 7,138,336 B2 | 11/2006 | Lee et al. |
| 7,141,278 B2 | 11/2006 | Koh et al. |
| 7,144,771 B2 | 12/2006 | Nam et al. |
| 7,154,138 B2 | 12/2006 | Hofmann et al. |
| 7,154,354 B2 | 12/2006 | Akram et al. |
| 7,154,778 B2 | 12/2006 | Forbes |
| 7,160,577 B2 | 1/2007 | Ahn et al. |
| 7,160,817 B2 | 1/2007 | Marsh |
| 7,166,886 B2 | 1/2007 | Forbes |
| 7,169,673 B2 | 1/2007 | Ahn et al. |
| 7,183,186 B2 | 2/2007 | Ahn et al. |
| 7,187,587 B2 | 3/2007 | Forbes |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,199,023 B2 | 4/2007 | Ahn et al. |
| 7,202,562 B2 | 4/2007 | Farrar |
| 7,205,218 B2 | 4/2007 | Ahn et al. |
| 7,211,492 B2 | 5/2007 | Forbes et al. |
| 7,214,994 B2 | 5/2007 | Forbes et al. |
| 7,221,017 B2 | 5/2007 | Forbes et al. |
| 7,221,586 B2 | 5/2007 | Forbes et al. |
| 7,235,501 B2 | 6/2007 | Ahn et al. |
| 7,235,854 B2 | 6/2007 | Ahn et al. |
| 7,250,338 B2 | 7/2007 | Bhattacharyya |
| 7,274,067 B2 | 9/2007 | Forbes |
| 7,279,413 B2 | 10/2007 | Park et al. |
| 7,285,261 B2 | 10/2007 | Mukhopadhyay |
| 7,297,617 B2 | 11/2007 | Farrar et al. |
| 7,301,172 B2 * | 11/2007 | Atwater et al. ............ 257/79 |
| 7,301,221 B2 | 11/2007 | Farrar et al. |
| 7,306,994 B2 | 12/2007 | Yoshitaka et al. |
| 7,309,664 B1 | 12/2007 | Marzolin et al. |
| 7,312,494 B2 | 12/2007 | Ahn et al. |
| 7,316,962 B2 | 1/2008 | Govindarajan |
| 7,323,423 B2 | 1/2008 | Brask et al. |
| 7,326,980 B2 | 2/2008 | Ahn et al. |
| 7,365,027 B2 | 4/2008 | Ahn et al. |
| 7,388,246 B2 | 6/2008 | Ahn et al. |
| 7,390,756 B2 | 6/2008 | Ahn et al. |
| 7,399,675 B2 | 7/2008 | Chindalore et al. |
| 7,402,876 B2 | 7/2008 | Ahn et al. |
| 7,405,454 B2 | 7/2008 | Ahn et al. |
| 7,410,910 B2 | 8/2008 | Ahn et al. |
| 7,411,237 B2 | 8/2008 | Ahn et al. |
| 7,432,548 B2 | 10/2008 | Forbes et al. |

| | | | | | |
|---|---|---|---|---|---|
| 7,435,657 B2 | 10/2008 | Shin | 2002/0001219 A1 | 1/2002 | Forbes et al. |
| 7,482,619 B2 | 1/2009 | Seol et al. | 2002/0001971 A1 | 1/2002 | Cho |
| 7,498,230 B2 | 3/2009 | Ahn et al. | 2002/0002216 A1 | 1/2002 | Tooley |
| 7,508,025 B2 | 3/2009 | Eldridge et al. | 2002/0003252 A1 | 1/2002 | Iyer |
| 7,510,983 B2 | 3/2009 | Ahn et al. | 2002/0003403 A1 | 1/2002 | Ghosh et al. |
| 7,517,783 B2 | 4/2009 | Ahn et al. | 2002/0004276 A1 | 1/2002 | Ahn et al. |
| 7,531,869 B2 | 5/2009 | Ahn et al. | 2002/0004277 A1 | 1/2002 | Ahn et al. |
| 7,545,241 B2 | 6/2009 | Wakabayashi et al. | 2002/0004279 A1 | 1/2002 | Agarwal et al. |
| 7,554,161 B2 | 6/2009 | Ahn et al. | 2002/0008324 A1 | 1/2002 | Shinkawata |
| 7,557,375 B2 | 7/2009 | Richardson et al. | 2002/0013052 A1 | 1/2002 | Visokay |
| 7,560,395 B2 | 7/2009 | Ahn | 2002/0014647 A1 | 2/2002 | Seidl et al. |
| 7,560,793 B2 | 7/2009 | Derderian et al. | 2002/0019116 A1 | 2/2002 | Sandhu et al. |
| 7,563,730 B2 | 7/2009 | Forbes et al. | 2002/0019125 A1 | 2/2002 | Juengling et al. |
| 7,572,695 B2 | 8/2009 | Ahn et al. | 2002/0020429 A1 | 2/2002 | Selbrede |
| 7,575,978 B2 | 8/2009 | Kraus et al. | 2002/0022156 A1 | 2/2002 | Bright |
| 7,588,988 B2 | 9/2009 | Ahn et al. | 2002/0024108 A1 | 2/2002 | Lucovsky et al. |
| 7,592,251 B2 | 9/2009 | Ahn et al. | 2002/0027264 A1 | 3/2002 | Forbes et al. |
| 7,595,528 B2 | 9/2009 | Duan et al. | 2002/0028541 A1 | 3/2002 | Lee et al. |
| 7,601,649 B2 | 10/2009 | Ahn et al. | 2002/0036939 A1 | 3/2002 | Tsai et al. |
| 7,602,030 B2 | 10/2009 | Ahn et al. | 2002/0037320 A1 | 3/2002 | Denes et al. |
| 7,605,030 B2 | 10/2009 | Forbes et al. | 2002/0046993 A1 | 4/2002 | Peterson et al. |
| 7,611,959 B2 | 11/2009 | Ahn et al. | 2002/0051859 A1 | 5/2002 | Iida et al. |
| 7,615,438 B2 | 11/2009 | Ahn et al. | 2002/0053869 A1 | 5/2002 | Ahn |
| 7,625,794 B2 | 12/2009 | Ahn et al. | 2002/0058578 A1 | 5/2002 | Shindo |
| 7,662,729 B2 | 2/2010 | Ahn et al. | 2002/0068466 A1 | 6/2002 | Lee et al. |
| 7,670,646 B2 | 3/2010 | Ahn et al. | 2002/0074565 A1 | 6/2002 | Flagan et al. |
| 7,687,409 B2 | 3/2010 | Ahn et al. | 2002/0076070 A1 | 6/2002 | Yoshikawa et al. |
| 7,700,989 B2 | 4/2010 | Ahn et al. | 2002/0083464 A1 | 6/2002 | Tomsen et al. |
| 7,719,065 B2 | 5/2010 | Ahn et al. | 2002/0084480 A1 | 7/2002 | Basceri et al. |
| 7,727,905 B2 | 6/2010 | Ahn et al. | 2002/0086507 A1 | 7/2002 | Park et al. |
| 7,763,362 B2 | 7/2010 | Jablonski et al. | 2002/0086521 A1 | 7/2002 | Ahn et al. |
| 7,776,762 B2 | 8/2010 | Ahn et al. | 2002/0086555 A1 | 7/2002 | Ahn et al. |
| 7,858,464 B2 | 12/2010 | Chae et al. | 2002/0089023 A1 | 7/2002 | Yu et al. |
| 7,863,667 B2 | 1/2011 | Ahn et al. | 2002/0089063 A1 | 7/2002 | Ahn et al. |
| 7,899,552 B2 | 3/2011 | Atanasoska et al. | 2002/0090806 A1 | 7/2002 | Ahn et al. |
| 7,908,016 B2 | 3/2011 | Atanasoska et al. | 2002/0094632 A1 | 7/2002 | Agarwal et al. |
| 7,915,174 B2 | 3/2011 | Ahn et al. | 2002/0105087 A1 | 8/2002 | Forbes et al. |
| 7,927,948 B2 * | 4/2011 | Sandhu et al. ............... 438/257 | 2002/0106536 A1 | 8/2002 | Lee et al. |
| 7,989,290 B2 | 8/2011 | Marsh et al. | 2002/0109138 A1 | 8/2002 | Forbes |
| 7,999,334 B2 | 8/2011 | Ahn et al. | 2002/0109158 A1 | 8/2002 | Forbes et al. |
| 8,071,476 B2 | 12/2011 | Ahn et al. | 2002/0109163 A1 | 8/2002 | Forbes et al. |
| 8,076,249 B2 | 12/2011 | Ahn et al. | 2002/0111001 A1 | 8/2002 | Ahn |
| 8,084,808 B2 | 12/2011 | Ahn et al. | 2002/0113261 A1 | 8/2002 | Iwasaki et al. |
| 8,093,666 B2 | 1/2012 | Ahn et al. | 2002/0117704 A1 | 8/2002 | Gonzalez |
| 8,110,469 B2 | 2/2012 | Gealy et al. | 2002/0117963 A1 | 8/2002 | Chuman et al. |
| 8,125,038 B2 | 2/2012 | Ahn et al. | 2002/0119297 A1 | 8/2002 | Forrest et al. |
| 8,154,066 B2 | 4/2012 | Ahn et al. | 2002/0119916 A1 | 8/2002 | Hassan |
| 8,211,388 B2 | 7/2012 | Woodfield et al. | 2002/0120297 A1 | 8/2002 | Shadduck |
| 8,288,818 B2 | 10/2012 | Sandhu et al. | 2002/0122885 A1 | 9/2002 | Ahn |
| 2002/0037603 A1 | 3/2001 | Eldridge et al. | 2002/0125490 A1 | 9/2002 | Chuman et al. |
| 2001/0000428 A1 | 4/2001 | Abadeer et al. | 2002/0130338 A1 | 9/2002 | Ahn et al. |
| 2001/0002280 A1 | 5/2001 | Sneh | 2002/0130378 A1 | 9/2002 | Forbes et al. |
| 2001/0002582 A1 | 6/2001 | Dunham | 2002/0132374 A1 | 9/2002 | Basceri et al. |
| 2001/0005625 A1 | 6/2001 | Sun et al. | 2002/0135048 A1 | 9/2002 | Ahn et al. |
| 2001/0009383 A1 | 7/2001 | Nakayama et al. | 2002/0137250 A1 | 9/2002 | Nguyen et al. |
| 2001/0009695 A1 | 7/2001 | Saanila et al. | 2002/0137271 A1 | 9/2002 | Forbes et al. |
| 2001/0010957 A1 | 8/2001 | Forbes et al. | 2002/0142536 A1 | 10/2002 | Zhang et al. |
| 2001/0011740 A1 | 8/2001 | DeBoer et al. | 2002/0142569 A1 | 10/2002 | Chang et al. |
| 2001/0012698 A1 | 8/2001 | Hayashi et al. | 2002/0142590 A1 | 10/2002 | Pan et al. |
| 2001/0013621 A1 | 8/2001 | Nakazato | 2002/0145845 A1 | 10/2002 | Hunt et al. |
| 2001/0014526 A1 | 8/2001 | Clevenger et al. | 2002/0145901 A1 | 10/2002 | Forbes et al. |
| 2001/0017369 A1 | 8/2001 | Iwasaki et al. | 2002/0146916 A1 | 10/2002 | Irino et al. |
| 2001/0017577 A1 | 8/2001 | Toko et al. | 2002/0148566 A1 | 10/2002 | Kitano et al. |
| 2001/0019876 A1 | 9/2001 | Juengling et al. | 2002/0155688 A1 | 10/2002 | Ahn |
| 2001/0024387 A1 | 9/2001 | Raaijmakers et al. | 2002/0155689 A1 | 10/2002 | Ahn |
| 2001/0030352 A1 | 10/2001 | Ruf et al. | 2002/0164420 A1 | 11/2002 | Derderian et al. |
| 2001/0034117 A1 | 10/2001 | Eldridge et al. | 2002/0167057 A1 | 11/2002 | Ahn et al. |
| 2001/0040430 A1 | 11/2001 | Ito et al. | 2002/0167089 A1 | 11/2002 | Ahn et al. |
| 2001/0041250 A1 | 11/2001 | Werkhoven et al. | 2002/0170671 A1 | 11/2002 | Matsushita et al. |
| 2001/0042505 A1 | 11/2001 | Vaartstra | 2002/0172799 A1 | 11/2002 | Subramanian |
| 2001/0050438 A1 | 12/2001 | Juengling et al. | 2002/0175423 A1 | 11/2002 | Forbes et al. |
| 2001/0051406 A1 | 12/2001 | Weimer et al. | 2002/0176293 A1 | 11/2002 | Forbes et al. |
| 2001/0051442 A1 | 12/2001 | Katsir et al. | 2002/0176989 A1 | 11/2002 | Knudsen et al. |
| 2001/0052752 A1 | 12/2001 | Ghosh et al. | 2002/0177244 A1 | 11/2002 | Hsu et al. |
| 2001/0053082 A1 | 12/2001 | Chipalkatti et al. | 2002/0177282 A1 | 11/2002 | Song |
| 2001/0053096 A1 | 12/2001 | Forbes et al. | 2002/0187091 A1 | 12/2002 | Deevi |
| 2001/0053577 A1 | 12/2001 | Forbes et al. | 2002/0190251 A1 | 12/2002 | Kunitake et al. |
| 2001/0055838 A1 | 12/2001 | Walker et al. | 2002/0190294 A1 | 12/2002 | Iizuka et al. |
| 2002/0000593 A1 | 1/2002 | Nishiyama et al. | 2002/0192366 A1 | 12/2002 | Cramer et al. |

| | | | | | | |
|---|---|---|---|---|---|---|
| 2002/0192919 A1 | 12/2002 | Bothra | | 2003/0157764 A1 | 8/2003 | Ahn et al. |
| 2002/0192974 A1 | 12/2002 | Ahn et al. | | 2003/0159653 A1 | 8/2003 | Dando et al. |
| 2002/0192975 A1 | 12/2002 | Ahn | | 2003/0161081 A1 | 8/2003 | Girardie |
| 2002/0192979 A1 | 12/2002 | Ahn | | 2003/0161782 A1 | 8/2003 | Kim |
| 2002/0193040 A1 | 12/2002 | Zhou | | 2003/0162399 A1 | 8/2003 | Singh |
| 2002/0195056 A1 | 12/2002 | Sandhu et al. | | 2003/0162587 A1 | 8/2003 | Tanamoto et al. |
| 2002/0196405 A1 | 12/2002 | Colgan et al. | | 2003/0170389 A1 | 9/2003 | Sandhu |
| 2002/0197793 A1 | 12/2002 | Dornfest et al. | | 2003/0170450 A1 | 9/2003 | Stewart et al. |
| 2002/0197856 A1 | 12/2002 | Matsuse et al. | | 2003/0172872 A1 | 9/2003 | Thakur et al. |
| 2002/0197881 A1 | 12/2002 | Ramdani et al. | | 2003/0173652 A1 | 9/2003 | Forbes et al. |
| 2003/0001190 A1 | 1/2003 | Basceri et al. | | 2003/0173653 A1 | 9/2003 | Forbes et al. |
| 2003/0001194 A1 | 1/2003 | DeBoer et al. | | 2003/0174529 A1 | 9/2003 | Forbes et al. |
| 2003/0001212 A1 | 1/2003 | Hu et al. | | 2003/0175411 A1 | 9/2003 | Kodas et al. |
| 2003/0001241 A1 | 1/2003 | Chakrabarti et al. | | 2003/0176023 A1 | 9/2003 | Forbes et al. |
| 2003/0003621 A1 | 1/2003 | Rhodes et al. | | 2003/0176025 A1 | 9/2003 | Forbes et al. |
| 2003/0003635 A1 | 1/2003 | Paranjpe et al. | | 2003/0176049 A1 | 9/2003 | Hegde et al. |
| 2003/0003702 A1 | 1/2003 | Ahn | | 2003/0176050 A1 | 9/2003 | Forbes et al. |
| 2003/0004051 A1 | 1/2003 | Kim et al. | | 2003/0176052 A1 | 9/2003 | Forbes et al. |
| 2003/0008243 A1 | 1/2003 | Ahn et al. | | 2003/0176053 A1 | 9/2003 | Forbes et al. |
| 2003/0008461 A1 | 1/2003 | Forbes et al. | | 2003/0179521 A1 | 9/2003 | Girardie |
| 2003/0015769 A1 | 1/2003 | DeBoer et al. | | 2003/0181039 A1 | 9/2003 | Sandhu et al. |
| 2003/0017717 A1 | 1/2003 | Ahn | | 2003/0181060 A1 | 9/2003 | Asai et al. |
| 2003/0020169 A1 | 1/2003 | Ahn et al. | | 2003/0183156 A1 | 10/2003 | Dando et al. |
| 2003/0020180 A1 | 1/2003 | Ahn et al. | | 2003/0183306 A1 | 10/2003 | Hehmann et al. |
| 2003/0020429 A1 | 1/2003 | Masaki et al. | | 2003/0183901 A1 | 10/2003 | Kanda et al. |
| 2003/0025142 A1 | 2/2003 | Rhodes et al. | | 2003/0185980 A1 | 10/2003 | Endo |
| 2003/0026697 A1 | 2/2003 | Subramanian et al. | | 2003/0185983 A1 | 10/2003 | Morfill et al. |
| 2003/0027360 A1 | 2/2003 | Hsu et al. | | 2003/0193061 A1 | 10/2003 | Osten |
| 2003/0030074 A1 | 2/2003 | Walker et al. | | 2003/0194853 A1 | 10/2003 | Jeon |
| 2003/0030093 A1 | 2/2003 | Agarwal et al. | | 2003/0194861 A1 | 10/2003 | Mardian et al. |
| 2003/0032238 A1 | 2/2003 | Kim et al. | | 2003/0194862 A1 | 10/2003 | Mardian |
| 2003/0032270 A1 | 2/2003 | Snyder et al. | | 2003/0196513 A1 | 10/2003 | Phillips et al. |
| 2003/0040196 A1 | 2/2003 | Lim et al. | | 2003/0203626 A1 | 10/2003 | Derderian et al. |
| 2003/0042512 A1 | 3/2003 | Gonzalez | | 2003/0205742 A1 | 11/2003 | Hsu et al. |
| 2003/0042526 A1 | 3/2003 | Weimer | | 2003/0207032 A1 | 11/2003 | Ahn et al. |
| 2003/0042527 A1 | 3/2003 | Forbes et al. | | 2003/0207540 A1 | 11/2003 | Ahn et al. |
| 2003/0042528 A1 | 3/2003 | Forbes | | 2003/0207564 A1 | 11/2003 | Ahn et al. |
| 2003/0042534 A1 | 3/2003 | Bhattacharyya | | 2003/0207566 A1 | 11/2003 | Forbes et al. |
| 2003/0043633 A1 | 3/2003 | Forbes et al. | | 2003/0207593 A1 | 11/2003 | Derderian et al. |
| 2003/0043637 A1 | 3/2003 | Forbes et al. | | 2003/0209324 A1 | 11/2003 | Fink |
| 2003/0045060 A1 | 3/2003 | Ahn et al. | | 2003/0213987 A1 | 11/2003 | Basceri |
| 2003/0045078 A1 | 3/2003 | Ahn et al. | | 2003/0216038 A1 | 11/2003 | Madhukar et al. |
| 2003/0045082 A1 | 3/2003 | Eldridge et al. | | 2003/0218199 A1 | 11/2003 | Forbes et al. |
| 2003/0048666 A1 | 3/2003 | Eldridge et al. | | 2003/0222300 A1 | 12/2003 | Basceri et al. |
| 2003/0048745 A1 | 3/2003 | Yoshikawa et al. | | 2003/0224600 A1 | 12/2003 | Cao et al. |
| 2003/0049900 A1 | 3/2003 | Forbes et al. | | 2003/0227033 A1 | 12/2003 | Ahn et al. |
| 2003/0049942 A1 | 3/2003 | Haukka et al. | | 2003/0228747 A1 | 12/2003 | Ahn et al. |
| 2003/0052356 A1 | 3/2003 | Yang et al. | | 2003/0230479 A1 | 12/2003 | Sarkas et al. |
| 2003/0052358 A1 | 3/2003 | Weimer | | 2003/0231992 A1 | 12/2003 | Sarkas et al. |
| 2003/0059535 A1 | 3/2003 | Luo et al. | | 2003/0232511 A1 | 12/2003 | Metzner et al. |
| 2003/0062261 A1 | 4/2003 | Shindo | | 2003/0234420 A1 | 12/2003 | Forbes |
| 2003/0064607 A1 | 4/2003 | Leu et al. | | 2003/0235064 A1 * | 12/2003 | Batra et al. .................. 365/100 |
| 2003/0067046 A1 | 4/2003 | Iwasaki et al. | | 2003/0235065 A1 | 12/2003 | Forbes |
| 2003/0068848 A1 | 4/2003 | Hsu et al. | | 2003/0235076 A1 | 12/2003 | Forbes |
| 2003/0072882 A1 | 4/2003 | Ninisto et al. | | 2003/0235961 A1 | 12/2003 | Metzner et al. |
| 2003/0089314 A1 | 5/2003 | Matsuki et al. | | 2004/0000150 A1 | 1/2004 | Symko et al. |
| 2003/0096490 A1 | 5/2003 | Borland et al. | | 2004/0004244 A1 | 1/2004 | Ahn et al. |
| 2003/0102501 A1 | 6/2003 | Yang et al. | | 2004/0004245 A1 | 1/2004 | Forbes et al. |
| 2003/0104666 A1 | 6/2003 | Bojarczuk, Jr. et al. | | 2004/0004247 A1 | 1/2004 | Forbes et al. |
| 2003/0106490 A1 | 6/2003 | Jallepally et al. | | 2004/0004859 A1 | 1/2004 | Forbes et al. |
| 2003/0107402 A1 | 6/2003 | Forbes et al. | | 2004/0005982 A1 | 1/2004 | Park et al. |
| 2003/0108612 A1 | 6/2003 | Xu et al. | | 2004/0007171 A1 | 1/2004 | Ritala et al. |
| 2003/0119246 A1 | 6/2003 | Ahn | | 2004/0009118 A1 | 1/2004 | Phillips et al. |
| 2003/0119291 A1 | 6/2003 | Ahn et al. | | 2004/0009678 A1 | 1/2004 | Asai et al. |
| 2003/0119313 A1 | 6/2003 | Yang et al. | | 2004/0009679 A1 | 1/2004 | Yeo et al. |
| 2003/0124748 A1 | 7/2003 | Summerfelt et al. | | 2004/0012043 A1 | 1/2004 | Gealy et al. |
| 2003/0124791 A1 | 7/2003 | Summerfelt et al. | | 2004/0013009 A1 | 1/2004 | Tsunoda et al. |
| 2003/0124794 A1 | 7/2003 | Girardie | | 2004/0014060 A1 | 1/2004 | Hoheisel et al. |
| 2003/0130127 A1 | 7/2003 | Hentges et al. | | 2004/0016944 A1 | 1/2004 | Ahn et al. |
| 2003/0132491 A1 | 7/2003 | Ahn et al. | | 2004/0023461 A1 | 2/2004 | Ahn et al. |
| 2003/0134475 A1 | 7/2003 | Hofmann et al. | | 2004/0023516 A1 | 2/2004 | Londergan et al. |
| 2003/0136995 A1 | 7/2003 | Geusic et al. | | 2004/0028811 A1 | 2/2004 | Cho et al. |
| 2003/0139039 A1 | 7/2003 | Ahn et al. | | 2004/0032773 A1 | 2/2004 | Forbes |
| 2003/0141560 A1 | 7/2003 | Sun | | 2004/0033661 A1 | 2/2004 | Yeo et al. |
| 2003/0142569 A1 | 7/2003 | Forbes | | 2004/0033681 A1 | 2/2004 | Ahn et al. |
| 2003/0143801 A1 | 7/2003 | Basceri et al. | | 2004/0033701 A1 | 2/2004 | Ahn et al. |
| 2003/0148577 A1 | 8/2003 | Merkulov et al. | | 2004/0036129 A1 | 2/2004 | Forbes et al. |
| 2003/0148627 A1 | 8/2003 | Aoki et al. | | 2004/0038525 A1 | 2/2004 | Meng et al. |
| 2003/0152700 A1 | 8/2003 | Asmussen et al. | | 2004/0038554 A1 | 2/2004 | Ahn |

| | | | | | | |
|---|---|---|---|---|---|---|
| 2004/0040494 A1 | 3/2004 | Vaartstra et al. | | 2004/0217410 A1 | 11/2004 | Meng et al. |
| 2004/0041208 A1 | 3/2004 | Bhattacharyya | | 2004/0217478 A1 | 11/2004 | Yamamoto et al. |
| 2004/0041591 A1 | 3/2004 | Forbes | | 2004/0219783 A1 | 11/2004 | Ahn et al. |
| 2004/0042128 A1 | 3/2004 | Slaughter et al. | | 2004/0222476 A1 | 11/2004 | Ahn et al. |
| 2004/0042256 A1 | 3/2004 | Forbes | | 2004/0224466 A1 | 11/2004 | Basceri et al. |
| 2004/0043541 A1 | 3/2004 | Ahn et al. | | 2004/0224467 A1 | 11/2004 | Basceri et al. |
| 2004/0043557 A1 | 3/2004 | Haukka et al. | | 2004/0224468 A1 | 11/2004 | Hwang |
| 2004/0043559 A1 | 3/2004 | Srividya et al. | | 2004/0224505 A1 | 11/2004 | Nguyen et al. |
| 2004/0043569 A1 | 3/2004 | Ahn et al. | | 2004/0224527 A1 | 11/2004 | Sarigiannis et al. |
| 2004/0043577 A1 | 3/2004 | Hill | | 2004/0229745 A1 | 11/2004 | Miyauchi et al. |
| 2004/0043578 A1 | 3/2004 | Marsh | | 2004/0233010 A1 | 11/2004 | Akram et al. |
| 2004/0043635 A1 | 3/2004 | Vaartstra | | 2004/0235313 A1 | 11/2004 | Frank et al. |
| 2004/0045807 A1 | 3/2004 | Sarkas et al. | | 2004/0245085 A1 | 12/2004 | Srinivasan |
| 2004/0046130 A1 | 3/2004 | Rao et al. | | 2004/0248398 A1 | 12/2004 | Ahn et al. |
| 2004/0051139 A1 | 3/2004 | Kanda et al. | | 2004/0251815 A1 | 12/2004 | Tokailin et al. |
| 2004/0055892 A1 | 3/2004 | Oh et al. | | 2004/0251841 A1 | 12/2004 | Negishi et al. |
| 2004/0058385 A1 | 3/2004 | Abel et al. | | 2004/0258192 A1 | 12/2004 | Angeliu et al. |
| 2004/0065171 A1 | 4/2004 | Hearley et al. | | 2004/0262700 A1 | 12/2004 | Ahn et al. |
| 2004/0065255 A1 | 4/2004 | Yang et al. | | 2004/0264236 A1 | 12/2004 | Chae et al. |
| 2004/0066484 A1 | 4/2004 | Tokailin et al. | | 2004/0266107 A1 | 12/2004 | Chindalore et al. |
| 2004/0070649 A1 | 4/2004 | Hess et al. | | 2004/0266117 A1 | 12/2004 | Hwang |
| 2004/0075111 A1 | 4/2004 | Chidambarrao et al. | | 2004/0266217 A1 | 12/2004 | Kim et al. |
| 2004/0075130 A1 | 4/2004 | Nam et al. | | 2005/0006727 A1 | 1/2005 | Forbes et al. |
| 2004/0076035 A1 | 4/2004 | Saito et al. | | 2005/0007817 A1 | 1/2005 | Forbes et al. |
| 2004/0077177 A1 | 4/2004 | Andreoni et al. | | 2005/0007820 A1 | 1/2005 | Chindalore et al. |
| 2004/0086897 A1 | 5/2004 | Mirkin et al. | | 2005/0009335 A1 | 1/2005 | Dean et al. |
| 2004/0087124 A1 | 5/2004 | Kubota et al. | | 2005/0009370 A1 | 1/2005 | Ahn |
| 2004/0092073 A1 | 5/2004 | Cabral, Jr. et al. | | 2005/0011748 A1 | 1/2005 | Beck et al. |
| 2004/0094801 A1 | 5/2004 | Liang et al. | | 2005/0017327 A1 | 1/2005 | Forbes et al. |
| 2004/0099889 A1 | 5/2004 | Frank et al. | | 2005/0019365 A1 | 1/2005 | Frauchiger et al. |
| 2004/0102002 A1 | 5/2004 | Sandhu et al. | | 2005/0019836 A1 | 1/2005 | Vogel et al. |
| 2004/0104439 A1 | 6/2004 | Haukka et al. | | 2005/0020017 A1 | 1/2005 | Ahn et al. |
| 2004/0104442 A1 | 6/2004 | Feudel et al. | | 2005/0023574 A1 | 2/2005 | Forbes et al. |
| 2004/0106249 A1 | 6/2004 | Huotari | | 2005/0023578 A1 | 2/2005 | Bhattacharyya |
| 2004/0107906 A1 | 6/2004 | Collins et al. | | 2005/0023584 A1 | 2/2005 | Derderian et al. |
| 2004/0108587 A1 | 6/2004 | Chudzik et al. | | 2005/0023594 A1 | 2/2005 | Ahn et al. |
| 2004/0110347 A1* | 6/2004 | Yamashita ............... 438/286 | | 2005/0023595 A1 | 2/2005 | Forbes et al. |
| 2004/0110348 A1 | 6/2004 | Ahn et al. | | 2005/0023602 A1 | 2/2005 | Forbes et al. |
| 2004/0110391 A1 | 6/2004 | Ahn et al. | | 2005/0023603 A1 | 2/2005 | Eldridge et al. |
| 2004/0115883 A1 | 6/2004 | Iwata et al. | | 2005/0023613 A1 | 2/2005 | Bhattacharyya |
| 2004/0126649 A1 | 7/2004 | Chen et al. | | 2005/0023624 A1 | 2/2005 | Ahn et al. |
| 2004/0127001 A1 | 7/2004 | Colburn et al. | | 2005/0023625 A1 | 2/2005 | Ahn et al. |
| 2004/0130951 A1 | 7/2004 | Forbes | | 2005/0023626 A1 | 2/2005 | Ahn et al. |
| 2004/0131795 A1 | 7/2004 | Kuo et al. | | 2005/0023627 A1 | 2/2005 | Ahn et al. |
| 2004/0131865 A1 | 7/2004 | Kim et al. | | 2005/0023650 A1 | 2/2005 | Forbes et al. |
| 2004/0135186 A1 | 7/2004 | Yamamoto | | 2005/0023664 A1 | 2/2005 | Chudzik et al. |
| 2004/0135951 A1 | 7/2004 | Stumbo et al. | | 2005/0024092 A1 | 2/2005 | Forbes |
| 2004/0135997 A1 | 7/2004 | Chan et al. | | 2005/0024945 A1 | 2/2005 | Forbes |
| 2004/0140513 A1 | 7/2004 | Forbes et al. | | 2005/0026349 A1 | 2/2005 | Forbes et al. |
| 2004/0144980 A1 | 7/2004 | Ahn et al. | | 2005/0026351 A1 | 2/2005 | Farrar |
| 2004/0145001 A1 | 7/2004 | Kanda et al. | | 2005/0026360 A1 | 2/2005 | Geusic et al. |
| 2004/0147098 A1 | 7/2004 | Mazen et al. | | 2005/0026374 A1 | 2/2005 | Ahn et al. |
| 2004/0149759 A1 | 8/2004 | Moser et al. | | 2005/0026375 A1 | 2/2005 | Forbes |
| 2004/0156578 A1 | 8/2004 | Geusic et al. | | 2005/0026458 A1 | 2/2005 | Basceri et al. |
| 2004/0158028 A1 | 8/2004 | Buhler | | 2005/0029545 A1 | 2/2005 | Forbes et al. |
| 2004/0159863 A1 | 8/2004 | Eldridge et al. | | 2005/0029547 A1 | 2/2005 | Ahn et al. |
| 2004/0160830 A1 | 8/2004 | Forbes | | 2005/0029604 A1 | 2/2005 | Ahn et al. |
| 2004/0161899 A1 | 8/2004 | Luo et al. | | 2005/0029605 A1 | 2/2005 | Ahn et al. |
| 2004/0164357 A1 | 8/2004 | Ahn et al. | | 2005/0030803 A1 | 2/2005 | Forbes et al. |
| 2004/0164365 A1 | 8/2004 | Ahn et al. | | 2005/0030825 A1 | 2/2005 | Ahn |
| 2004/0165412 A1 | 8/2004 | Forbes | | 2005/0031785 A1 | 2/2005 | Carlisle et al. |
| 2004/0166628 A1 | 8/2004 | Park et al. | | 2005/0032292 A1 | 2/2005 | Ahn et al. |
| 2004/0168627 A1 | 9/2004 | Conley, Jr. et al. | | 2005/0032299 A1 | 2/2005 | Basceri et al. |
| 2004/0169453 A1 | 9/2004 | Ahn et al. | | 2005/0032342 A1 | 2/2005 | Forbes et al. |
| 2004/0171280 A1 | 9/2004 | Conley, Jr. et al. | | 2005/0034662 A1 | 2/2005 | Ahn |
| 2004/0175882 A1 | 9/2004 | Ahn et al. | | 2005/0035430 A1 | 2/2005 | Beigel |
| 2004/0178439 A1 | 9/2004 | Ahn et al. | | 2005/0036370 A1 | 2/2005 | Forbes |
| 2004/0183108 A1 | 9/2004 | Ahn | | 2005/0037374 A1 | 2/2005 | Melker et al. |
| 2004/0185630 A1 | 9/2004 | Forbes et al. | | 2005/0037563 A1 | 2/2005 | Ahn |
| 2004/0185654 A1 | 9/2004 | Ahn | | 2005/0037574 A1 | 2/2005 | Sugiyama |
| 2004/0189175 A1 | 9/2004 | Ahn et al. | | 2005/0040034 A1 | 2/2005 | Landgraf et al. |
| 2004/0196620 A1 | 10/2004 | Knudsen et al. | | 2005/0041455 A1 | 2/2005 | Beigel et al. |
| 2004/0197946 A1 | 10/2004 | Vaartstra et al. | | 2005/0041503 A1 | 2/2005 | Chindalore et al. |
| 2004/0198069 A1 | 10/2004 | Metzner et al. | | 2005/0048414 A1 | 3/2005 | Harnack et al. |
| 2004/0202032 A1 | 10/2004 | Forbes | | 2005/0048570 A1 | 3/2005 | Weber et al. |
| 2004/0203254 A1 | 10/2004 | Conley, Jr. et al. | | 2005/0048796 A1 | 3/2005 | Numasawa et al. |
| 2004/0206957 A1 | 10/2004 | Inoue et al. | | 2005/0051824 A1 | 3/2005 | Iizuka et al. |
| 2004/0212426 A1 | 10/2004 | Beigel | | 2005/0051828 A1 | 3/2005 | Park et al. |
| 2004/0214399 A1 | 10/2004 | Ahn et al. | | 2005/0053826 A1 | 3/2005 | Wang et al. |

| Pub. No. | Date | Inventor |
|---|---|---|
| 2005/0054165 A1 | 3/2005 | Ahn et al. |
| 2005/0059213 A1 | 3/2005 | Steimle et al. |
| 2005/0061785 A1 | 3/2005 | Schroder et al. |
| 2005/0062659 A1 | 3/2005 | Packer |
| 2005/0064185 A1 | 3/2005 | Buretea et al. |
| 2005/0070098 A1 | 3/2005 | Bruley |
| 2005/0070126 A1 | 3/2005 | Senzaki |
| 2005/0077519 A1 | 4/2005 | Ahn et al. |
| 2005/0082599 A1 | 4/2005 | Forbes |
| 2005/0085040 A1 | 4/2005 | Forbes |
| 2005/0085152 A1 | 4/2005 | Tokailin et al. |
| 2005/0087134 A1 | 4/2005 | Ahn |
| 2005/0093054 A1 | 5/2005 | Jung et al. |
| 2005/0112874 A1 | 5/2005 | Skarp et al. |
| 2005/0118807 A1 | 6/2005 | Kim et al. |
| 2005/0124109 A1 | 6/2005 | Quevedo-Lopez et al. |
| 2005/0124174 A1 | 6/2005 | Ahn et al. |
| 2005/0124175 A1 | 6/2005 | Ahn et al. |
| 2005/0138262 A1 | 6/2005 | Forbes |
| 2005/0140462 A1 | 6/2005 | Akram et al. |
| 2005/0145911 A1 | 7/2005 | Forbes et al. |
| 2005/0145957 A1 | 7/2005 | Ahn et al. |
| 2005/0145959 A1 | 7/2005 | Forbes |
| 2005/0146938 A1 | 7/2005 | Forbes |
| 2005/0151184 A1 | 7/2005 | Lee et al. |
| 2005/0151261 A1 | 7/2005 | Kellar et al. |
| 2005/0157549 A1 | 7/2005 | Mokhlesi et al. |
| 2005/0158973 A1 | 7/2005 | Ahn et al. |
| 2005/0164521 A1 | 7/2005 | Ahn et al. |
| 2005/0169054 A1 | 8/2005 | Forbes |
| 2005/0173755 A1 | 8/2005 | Forbes |
| 2005/0181624 A1* | 8/2005 | Kammler et al. ............ 438/766 |
| 2005/0190617 A1 | 9/2005 | Forbes et al. |
| 2005/0199947 A1 | 9/2005 | Forbes |
| 2005/0202659 A1 | 9/2005 | Li et al. |
| 2005/0212041 A1 | 9/2005 | Wu et al. |
| 2005/0212119 A1 | 9/2005 | Shero et al. |
| 2005/0215015 A1 | 9/2005 | Ahn et al. |
| 2005/0218462 A1 | 10/2005 | Ahn et al. |
| 2005/0227442 A1 | 10/2005 | Ahn et al. |
| 2005/0260357 A1 | 11/2005 | Olsen et al. |
| 2005/0265063 A1 | 12/2005 | Forbes |
| 2005/0266700 A1 | 12/2005 | Jursich et al. |
| 2005/0277256 A1 | 12/2005 | Ahn et al. |
| 2005/0280067 A1 | 12/2005 | Ahn et al. |
| 2005/0285220 A1 | 12/2005 | Farrar |
| 2005/0285225 A1 | 12/2005 | Ahn et al. |
| 2005/0285226 A1 | 12/2005 | Lee |
| 2006/0000412 A1 | 1/2006 | Ahn et al. |
| 2006/0001049 A1 | 1/2006 | Forbes |
| 2006/0001151 A1 | 1/2006 | Ahn et al. |
| 2006/0002192 A1 | 1/2006 | Forbes et al. |
| 2006/0003517 A1 | 1/2006 | Ahn et al. |
| 2006/0008966 A1 | 1/2006 | Forbes et al. |
| 2006/0019033 A1 | 1/2006 | Muthukrishnan et al. |
| 2006/0019501 A1 | 1/2006 | Jin et al. |
| 2006/0023513 A1 | 2/2006 | Forbes et al. |
| 2006/0024975 A1 | 2/2006 | Ahn et al. |
| 2006/0027882 A1 | 2/2006 | Mokhlesi |
| 2006/0028867 A1 | 2/2006 | Forbes et al. |
| 2006/0028869 A1 | 2/2006 | Forbes et al. |
| 2006/0035405 A1 | 2/2006 | Park et al. |
| 2006/0043492 A1 | 3/2006 | Ahn et al. |
| 2006/0043504 A1 | 3/2006 | Ahn et al. |
| 2006/0046322 A1 | 3/2006 | Farrar et al. |
| 2006/0046383 A1 | 3/2006 | Chen et al. |
| 2006/0046384 A1 | 3/2006 | Joo et al. |
| 2006/0046505 A1 | 3/2006 | Ahn et al. |
| 2006/0046522 A1 | 3/2006 | Ahn et al. |
| 2006/0054943 A1 | 3/2006 | Li et al. |
| 2006/0063318 A1 | 3/2006 | Datta et al. |
| 2006/0081895 A1 | 4/2006 | Lee et al. |
| 2006/0081911 A1 | 4/2006 | Batra et al. |
| 2006/0105523 A1 | 5/2006 | Afzali-Ardakani et al. |
| 2006/0110883 A1* | 5/2006 | Min ............ 438/260 |
| 2006/0118853 A1 | 6/2006 | Takata et al. |
| 2006/0118949 A1 | 6/2006 | Farrar |
| 2006/0119224 A1 | 6/2006 | Keolian et al. |
| 2006/0125026 A1 | 6/2006 | Li et al. |
| 2006/0125030 A1 | 6/2006 | Ahn et al. |
| 2006/0128168 A1 | 6/2006 | Ahn et al. |
| 2006/0131702 A1 | 6/2006 | Forbes et al. |
| 2006/0148180 A1 | 7/2006 | Ahn et al. |
| 2006/0170032 A1 | 8/2006 | Bhattacharyya |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0186458 A1 | 8/2006 | Forbes et al. |
| 2006/0189079 A1 | 8/2006 | Merchant et al. |
| 2006/0189154 A1 | 8/2006 | Ahn et al. |
| 2006/0194438 A1 | 8/2006 | Rao et al. |
| 2006/0223337 A1 | 10/2006 | Ahn et al. |
| 2006/0228868 A1 | 10/2006 | Ahn et al. |
| 2006/0231889 A1 | 10/2006 | Chen et al. |
| 2006/0237764 A1 | 10/2006 | Ahn et al. |
| 2006/0237803 A1 | 10/2006 | Zhu et al. |
| 2006/0244082 A1 | 11/2006 | Ahn et al. |
| 2006/0244100 A1 | 11/2006 | Ahn et al. |
| 2006/0244108 A1 | 11/2006 | Forbes |
| 2006/0245984 A1 | 11/2006 | Kulkarni et al. |
| 2006/0246741 A1 | 11/2006 | Ahn et al. |
| 2006/0252202 A1 | 11/2006 | Dai et al. |
| 2006/0252211 A1 | 11/2006 | Ahn et al. |
| 2006/0255470 A1 | 11/2006 | Ahn et al. |
| 2006/0257563 A1 | 11/2006 | Doh et al. |
| 2006/0258097 A1 | 11/2006 | Forbes et al. |
| 2006/0261376 A1 | 11/2006 | Forbes et al. |
| 2006/0261397 A1 | 11/2006 | Ahn et al. |
| 2006/0261438 A1 | 11/2006 | Forbes |
| 2006/0261448 A1 | 11/2006 | Forbes et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0264066 A1 | 11/2006 | Bartholomew et al. |
| 2006/0267113 A1 | 11/2006 | Tobin et al. |
| 2006/0270147 A1 | 11/2006 | Ahn et al. |
| 2006/0273411 A1 | 12/2006 | Triyoso et al. |
| 2006/0274580 A1 | 12/2006 | Forbes |
| 2006/0281330 A1 | 12/2006 | Ahn et al. |
| 2006/0284246 A1 | 12/2006 | Forbes et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0018342 A1 | 1/2007 | Sandhu et al. |
| 2007/0020835 A1 | 1/2007 | Ahn et al. |
| 2007/0020856 A1 | 1/2007 | Sadd et al. |
| 2007/0023894 A1 | 2/2007 | Farrar |
| 2007/0027882 A1 | 2/2007 | Kulkarni |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0046402 A1 | 3/2007 | Mukaiyama et al. |
| 2007/0047319 A1 | 3/2007 | Bhattacharyya |
| 2007/0048926 A1 | 3/2007 | Ahn |
| 2007/0048953 A1 | 3/2007 | Gealy et al. |
| 2007/0048989 A1 | 3/2007 | Ahn et al. |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0059929 A1 | 3/2007 | Cho et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0103068 A1 | 5/2007 | Bawendi et al. |
| 2007/0105312 A1* | 5/2007 | Min ............ 438/257 |
| 2007/0105313 A1 | 5/2007 | Forbes |
| 2007/0111544 A1 | 5/2007 | Ahn |
| 2007/0128736 A1 | 6/2007 | Chang et al. |
| 2007/0134931 A1 | 6/2007 | Ahn et al. |
| 2007/0134942 A1 | 6/2007 | Ahn et al. |
| 2007/0141784 A1 | 6/2007 | Wager, III et al. |

| | | |
|---|---|---|
| 2007/0141832 A1 | 6/2007 | Farrar |
| 2007/0151861 A1 | 7/2007 | Xi et al. |
| 2007/0158765 A1 | 7/2007 | Ahn et al. |
| 2007/0178643 A1 | 8/2007 | Forbes et al. |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0228442 A1 | 10/2007 | Kakimoto |
| 2007/0228526 A1 | 10/2007 | Shimizu et al. |
| 2007/0234949 A1 | 10/2007 | Ahn et al. |
| 2007/0254488 A1 | 11/2007 | Huotari et al. |
| 2007/0287261 A1 | 12/2007 | Raaijmakers et al. |
| 2007/0298536 A1* | 12/2007 | Ren et al. ............ 438/102 |
| 2008/0014689 A1 | 1/2008 | Cleavelin et al. |
| 2008/0029790 A1 | 2/2008 | Ahn et al. |
| 2008/0032424 A1 | 2/2008 | Ahn et al. |
| 2008/0042211 A1 | 2/2008 | Bhattacharyya et al. |
| 2008/0048225 A1 | 2/2008 | Ahn et al. |
| 2008/0057659 A1 | 3/2008 | Forbes |
| 2008/0057690 A1 | 3/2008 | Forbes |
| 2008/0087890 A1 | 4/2008 | Ahn et al. |
| 2008/0087945 A1 | 4/2008 | Forbes et al. |
| 2008/0110486 A1 | 5/2008 | Tsakalakos et al. |
| 2008/0121962 A1 | 5/2008 | Forbes et al. |
| 2008/0121969 A1 | 5/2008 | Sandhu et al. |
| 2008/0124907 A1 | 5/2008 | Forbes et al. |
| 2008/0124908 A1 | 5/2008 | Forbes et al. |
| 2008/0157171 A1 | 7/2008 | Majhi et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0220618 A1 | 9/2008 | Ahn et al. |
| 2008/0224115 A1 | 9/2008 | Bakkers et al. |
| 2008/0246114 A1 | 10/2008 | Abrokwah et al. |
| 2008/0296650 A1 | 12/2008 | Ahn et al. |
| 2009/0004801 A1 | 1/2009 | Ahn et al. |
| 2009/0032910 A1 | 2/2009 | Ahn et al. |
| 2009/0075035 A1 | 3/2009 | O'Brien et al. |
| 2009/0090952 A1 | 4/2009 | Olsen et al. |
| 2009/0173991 A1 | 7/2009 | Marsh et al. |
| 2009/0218612 A1 | 9/2009 | Forbes et al. |
| 2009/0302371 A1 | 12/2009 | Kraus et al. |
| 2010/0006918 A1 | 1/2010 | Ahn et al. |
| 2010/0015462 A1 | 1/2010 | Jablonski et al. |
| 2010/0029054 A1 | 2/2010 | Ahn et al. |
| 2010/0044771 A1 | 2/2010 | Ahn et al. |
| 2010/0052033 A1 | 3/2010 | Ahn et al. |
| 2010/0176442 A1 | 7/2010 | Ahn et al. |
| 2010/0224944 A1 | 9/2010 | Ahn et al. |
| 2010/0301406 A1 | 12/2010 | Ahn et al. |
| 2011/0079273 A1 | 4/2011 | Arango et al. |
| 2011/0140075 A1 | 6/2011 | Zhou et al. |
| 2011/0210386 A1 | 9/2011 | Sandhu et al. |
| 2011/0255212 A1 | 10/2011 | Liu et al. |
| 2011/0278661 A1 | 11/2011 | Marsh et al. |
| 2011/0298028 A1 | 12/2011 | Ahn et al. |
| 2012/0074487 A1 | 3/2012 | Ahn et al. |
| 2012/0088373 A1 | 4/2012 | Ahn et al. |
| 2010/0108052 A1 | 5/2012 | Ahn et al. |
| 2012/0108052 A1 | 5/2012 | Ahn et al. |
| 2012/0196418 A1 | 8/2012 | Ahn et al. |
| 2012/0202358 A1 | 8/2012 | Gealy et al. |

FOREIGN PATENT DOCUMENTS

| | | |
|---|---|---|
| EP | 578856 A1 | 7/1992 |
| EP | 0540993 A1 | 5/1993 |
| EP | 0547890 | 6/1993 |
| EP | 0681315 | 11/1995 |
| EP | 1096042 A1 | 5/2001 |
| EP | 1122795 A2 | 8/2001 |
| EP | 1124262 A2 | 8/2001 |
| EP | 1324376 A2 | 7/2003 |
| EP | 1358678 A1 | 11/2003 |
| GB | 2158995 A | 11/1985 |
| GB | 2355597 A | 4/2001 |
| JP | 03028162 | 2/1991 |
| JP | 3116774 A | 5/1991 |
| JP | 3222367 A | 10/1991 |
| JP | 4-92416 | 3/1992 |
| JP | 4162628 A | 6/1992 |
| JP | 4230023 A | 8/1992 |
| JP | 5090169 A | 4/1993 |
| JP | 07-320996 | 12/1995 |
| JP | 09-293845 | 11/1997 |
| JP | 11335849 A | 12/1999 |
| JP | 2000192241 A | 7/2000 |
| JP | 01044420 | 2/2001 |
| JP | 2001230505 A | 8/2001 |
| JP | 2001332546 A | 11/2001 |
| KR | 200378075 Y1 | 10/2003 |
| WO | WO-0197257 A2 | 12/2001 |
| WO | WO-0231875 A2 | 4/2002 |
| WO | WO-0233729 A2 | 4/2002 |
| WO | WO-0243115 A2 | 5/2002 |
| WO | WO-03063250 A1 | 7/2003 |
| WO | WO-03083947 A2 | 10/2003 |
| WO | WO-2004079796 A3 | 9/2004 |

OTHER PUBLICATIONS

"'Green' Chiller Technology Rolled Out for Earth Day", Penn State News Release, http://www.sciencedaily.com/releases/2004/04/040421232304.htm, (Apr. 22, 2004).

"Application Specific DRAM", Toshiba America Electronic Components, Inc., (1994), C178, C-260, C 218.

"Fundamentals of Sonic Cleaning", [Online]. Retrieved from the Internet: <URL: http://www.icknowledge.com/misc_technology/Megasonic.pdf>, (Archived Apr. 20, 2003), 1 pg.

"Hyper Page Mode DRAM", Electronic Engineering, 66(813), Woolwich, London, GB, (Sep. 1994), 47-48.

"Hyper Page Mode DRAM", 8029 Electronic Engineering 66, No. 813, Woolwich, London GB, (Sep. 1994), 47-48.

"Hyper Page Mode DRAM", Electronic Engineering, 66(813), (Sep. 1994), 47-48.

"Improved Metallurgy for Wiring Very Large Scale Integrated Circuits", International Technology Disclosures, 4, Abstract, (1986), 1 page.

"Improved Metallurgy for Wiring Very Large Scale Integrated Circuits", International Technology Disclosures, vol. 4, No. 9, (1986), p. 2.

"International Application Serial No. PCT/US 03/17730, International Search Report mailed Oct. 22, 2003", 6 pgs.

"International Application Serial No. PCT/US2005/031159, International Search Report mailed Jan. 24, 2006", 7 pgs.

"International Search Report, for Application No. PCT/US2004/006685, date mailed Nov. 23, 2004", 77 pages.

"International Technology for Semiconductor Roadmap, 1999 edition", Semiconductor Industry Association, [Online]. Retrieved from the Internet: <URL: http://public.itrs.net/Files/2001ITRS/Links/1999_SIA_Roadmap/>, (1999), 371 pgs.

"International Technology Roadmap for Semiconductors, 2001 Edition", Organized by International SEMATECH, [Online]. Retrieved from the Internet: <URL: http://public.itrs.net/Files/2001ITRS/Home.html>, (2001), 469 pages.

"Megasonics—Sage Solvent Alternatives Guide", Research Triangle Institute, [Online]. Retrieved from the Internet: <URL: http://clean.rti.org/alt.cfm?id=me&cat=ov>, (Mar. 15, 1995).

"Micron Semiconductor, Inc.", 1994 DRAM Data Book, entire book.

"Packaging", Electronic Materials Handbook, vol. 1, ASM International, (1989), pp. 105, 768-769.

"Praseodymium Oxide, Pr2O3 for Optical Coating", Technical Publication by CERAC about Praseodymium Oxide, http://www.cerac.com/pubs/proddata/pr2o3.htm, (Sep. 21, 2005), 1-2.

"Samsung Synchronous DRAM", Samsung Electronics, Revision 1, (Mar. 1993), 1-16.

"Synchronous DRAM 2 MEG X 8 SDRAM", Micron Semiconductors, Inc., (1994), 1-18.

"Thin Solid Films, Elsevier Science", [Online]. Retrieved from the Internet: <URL: http://202.114.9.3/xueke/wldz/ak/thin.htm>.

"What is megasonics cleaning?", ProSys, Inc., [Online]. Retrieved from the Internet: <URL: http://www.prosysmeg.com/technology/articles/megasonics_cleaning.php>, (Copyright 1997-2004).

Aaltonen, Titta, et al., "Atomic Layer Deposition of Iridium Thin Films", Journal of the Electrochemical Society, 151(8), (2004), G489-G492.

Aaltonen, Titta, et al., "Atomic Layer Deposition of Ruthenium Thin Films from Ru(thd)3 and Oxygen", Chemical Vapor Deposition, 10(4), (Sep. 2004), 215-219.

Aaltonen, Titta, et al., "Ruthenium Thin Films Grown by Atomic Layer Deposition", Chemical Vapor Deposition, 9(1), (Jan. 2003), 45-49.

Aarik, J., et al., "Atomic layer growth of epitaxial TiO/sub 2/ thin films from TiCl/sub 4/ and H/sub 2/O on alpha -Al/sub 2/O/sub 3/ substrates", Journal of Crystal Growth, 242(1-2), (2002), 189-198.

Aarik, J., et al., "Phase transformations in hafnium dioxide thin films grown by atomic layer deposition at high temperatures", Applied Surface Science, 173(1-2), (Mar. 2001), 15-21.

Aarik, Jaan, et al., "Anomalous effect of temperature on atomic layer deposition of titanium dioxide", Journal of Crystal Growth, 220(4), (Dec. 2000), 531-537.

Aarik, Jaan, et al., "Atomic layer deposition of TiO2 thin films from TiI4 and H2O", Applied Surface Science 193, (2002), 277-286.

Aarik, Jaan, et al., "Hafnium tetraiodide and oxygen as precursors for atomic layer deposition of hafnium oxide thin films", Thin Solid Films, 418(2), (Oct. 15, 2002), 69-72.

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Abbas, S. A., et al., "N-Channel Igfet Design Limitations Due to Hot Electron Trapping", Technical Digest, International Electron Devices Meeting Washington, DC, (Dec. 1975), 35-38.

Abe, T, "Silicon Wafer-Bonding Process Technology for SOI Structures", Extended Abstracts of the 22nd (1990 International) Conference on Solid State Devices and Materials, (1990), 853-856.

Adelmann, C, et al., "Atomic-layer epitaxy of GaN quantum wells and quantum dots on (0001) AlN", Journal of Applied Physics, 91(8), (Apr. 15, 2002), 5498-5500.

Adler, E., et al., "The Evolution of IBM CMOS DRAM Technology", IBM Journal of Research & Development, 39(1-2), (Jan.-Mar. 1995), 167-188.

Afanas'Ev, V, et al., "Electron energy barriers between (100)Si and ultrathin stacks of SiO2, Al2O3, and ZrO3 and ZrO2 insulators", Applied Physics Letters, 78(20), (May 14, 2001), 3073-3075.

Agarwal, Vikas, "A service creation environment based on end to end composition of Web services", Proceedings of the 14th international conference on World Wide Web, (2005), 128-137.

Ahn, Seong-Deok, et al., "Surface Morphology Improvement of Metalorganic Chemical Vapor Deposition Al Films by Layered Deposition of Al and Ultrathin TiN", Japanese Journal of Applied Physics, Part 1 (Regular Papers, Short Notes & Review Papers), 39(6A), (Jun. 2000), 3349-3354.

Akasaki, Isamu, et al., "Effects of AlN buffer layer on crystallographic structure and on electrical and optical properties of GaN and Gal −xAlxN (0 < x 0.4) films grown on sapphire substrate by MOVPE", Journal of Crystal Growth, 98(1-2), (Nov. 1, 1989), 209-219.

Alen, Petra, et al., "Atomic Layer deposition of Ta(Al)N(C) thin films using trimethylaluminum as a reducing agent", Journal of the Electrochemical Society, 148(10), (Oct. 2001), G566-G571.

Alers, G. B., et al., "Intermixing at the tantalum oxide/silicon interface in gate dielectric structures", Applied Physics Letters, 73(11), (Sep. 14, 1998), 1517-1519.

Alivisatos, A. P., "Semiconductor Clusters, Nanocrystals, and quantum Dots", Science, 271, (Feb. 16, 1996), 933-937.

Alok, D., et al., "Electrical Properties of Thermal Oxide Grown on N-type 6H-Silicon Carbide", Applied Physics Letters, 64, (May 23, 1994), 2845-2846.

American Society for Metals, "Metals Handbook", Properties and Selection: Nonferrous Alloys and Pure Metals, Ninth Edition, vol. 2, Metals Park, Ohio:, (1979), 157, 395.

Anwander, Reiner, et al., "Volatile Donor-Functionalized Alkoxy Derivatives of Lutetium and Their Structural Characterization", Inorganic Chemistry, 36(16), (Jul. 30, 1997), 3545-3552.

Apostolopoulos, G., et al., "Complex admittance analysis for La[sub 2]Hf[sub 2]O[sub 7]/SiO[sub 2] high-k dielectric stacks", Applied Physics Letters, 84(2), (Jan. 12, 2004), 260-262.

Arnoldussen, Thomas C, "A Modular Transmission Line/Reluctance Head Model", IEEE Transactions on Magnetics, 24, (Nov. 1988), 2482-2484.

Arya, S. P.S., et al., "Conduction properties of thin Al/sub 2/O/sub 3/ films", Thin Solid Films, 91(4), (May 28, 1982), 363-374.

Asai, S., "Technology Challenges for Integration Near and Below 0.1 micrometer", Proceedings of the IEEE, 85(4), Special Issue on Nanometer-Scale Science & Technology, (Apr. 1997), 505-520.

Asari, K, et al., "Multi-mode and multi-level technologies for FeRAM embedded reconfigurable hardware", Solid-State Circuits Conference, 1999. Digest of Technical Papers. ISSCC. 1999 IEEE International, (Feb. 15-17, 1999), 106-107.

Aspinall, Helen C., et al., "Growth of Praseodymium Oxide and Praseodymium Silicate Thin Films by Liquid Injection MOCVD", Chemical Vapor Deposition, 10(2), (Mar. 2004), 83-89.

Atanassova, E., et al., "Breakdown Fields and Conduction Mechanisms in thin Ta2O5 Layers on Si for high density DRAMs", Microelectronics Reliability, 42, (2002), 157-173.

Auberton-Herve, A. J., "SOI: Materials to Systems", Digest of the International Electron Device Meeting, San Francisco, (Dec. 1996), 3-10.

Bai, Y., et al., "Photosensitive Polynorbornene as a Dielectric Material for Packaging Applications", Proceedings of the 2001 International Symposium on Advanced Packaging Materials, (2001), 322-326.

Baldwin, G. L., et al., "The Electronic Conduction Mechanism of Hydrogenated Nanocrystalline Silicon Films", Proc. 4th Int. Conf. on Solid-State and Int. Circuit Tech, Beijing, (1995), 66-68.

Ballister, Stephen C, et al., "Shipboard Electronics Thermoacoustic Cooler", Report number: A415003, Naval Postgraduate School, Monterey, CA, Abstract, (Jun. 1995).

Banerjee, S., "Applications of silicon-germanium-carbon in MOS and bipolar transistors", Proceedings of the SPIE—The International Society for Optical Engineering, 3212, (1997), 118-128.

Banerjee, S. K., et al., "Characterization of Trench Transistors for 3-D Memories", 1986 Symposium on VLSI Technology, Digest of Technical Papers, San Diego, CA, (May 1986), 79-80.

Bauer, M., et al., "A Multilevel-Cell 32 Mb Flash Memory", Digest IEEE, Solid-State Circuits Conf. (1995), 440.

Beensh-Marchwicka, G., et al., "Preparation of thermosensitive magnetron sputtered thin films", Vacuum, 53(1-2), (May 1999), 47-52.

Bendoraitis, J G, et al., "Optical energy gaps in the monoclinic oxides of hafnium and zirconium and their solid solutions", Journal of Physical Chemistry, 69(10), (1965), 3666-3667.

Bengtsson, Stefan, et al., "Interface charge control of directly bonded silicon structures", J. Appl. Phys., 66(3), (Aug. 1989), 1231-1239.

Benjamin, M., "Uv Photoemission Study of Heteroepitaxial AlGaN Films Grown on 6HSiC", Applied Surface Science, 104/105, (Sep. 1996), 455-460.

Britton, J, et al., "Metal-nitride-oxide IC memory retains data for meter reader", Electronics, 45(22), (Oct. 23, 1972), 119-23.

Choi, S. C., et al., "Epitaxial growth of Y2O3 films on Si(100) without an interfacial oxide layer", Applied Physics Letters, vol. 71, No. 7, (Aug. 18, 1997), 903-905.

Cricchi, J R, et al., "Hardened MNOS/SOS electrically reprogrammable nonvolatile memory", IEEE Transactions on Nuclear Science, 24(6), (Dec. 1977), 2185-9.

Dover, V., et al., "Deposition of Uniform Zr-Sn-Ti-O Films by On-Axis Reactive Sputtering", IEEE Electron Device Letters, vol. 19, No. 9, (Sep. 1998), 329-331.

Engelhardt, M., "Modern Applications of Plasma Etching and Patterning in Silicon Process Technology", Contributions to Plasma Physics, 39(5), (1999), 473-478.

Ferris-Prabhu, A V, "Tunnelling theories of non-volatile semiconductor memories", Physica Status Solidi A, 35(1), (May 16, 1976), 243-50.

Fisch, D E, et al., "Analysis of thin film ferroelectric aging", Proc. IEEE Int. Reliability Physics Symp., (1990), 237-242.

Forsgren, Katarina, "CVD and ALD of Group IV- and V-Oxides for Dielectric Applications", Comprehensive Summaries of Uppsala Dissertation from the Faculty of Science and Technology, 665, (2001), 665.

Foster, R., et al., "High Rate Low-Temperature Selective Tungsten", In: Tungsten and Other Refractory Metals for VLSI Applications III, V.A. Wells, ed., Materials Res. Soc., Pittsburgh, PA, (1988), 69-72.

Kalavade, Pranav, et al., "A novel sub-10 nm transistor", 58th DRC. Device Research Conference. Conference Digest, (Jun. 19-21, 2000), 71-72.

Kohyama, Y., et al., "Buried Bit-Line Cell for 64MB DRAMs", 1990 Symposium on VLSI Technology, Digest of Technical Papers, Honolulu, HI, (Jun. 4-7, 1990), 17-18.

Kolliopoulou, S, et al., "Hybrid silicon-organic nanoparticle memory device", Journal of Applied Physics, 94(8), (2003), 5234-5239.

Krauter, G., et al., "Room Temperature Silicon Wafer Bonding with Ultra-Thin Polymer Films", Advanced Materials, 9(5), (1997), 417-420.

Lee, C., et al., "Self-Assembly of Metal Nanocrystals on Ultrathin Oxide for Nonvolatile Memory Applications", J. Elect. Mater; vol. 34(1), (Jan. 2005), 1-11.

Leskela, M, "ALD precursor chemistry: Evolution and future challenges", Journal de Physique IV (Proceedings), 9(8), (Sep. 1999), 837-852.

Liu, Z., et al., "Metal Nanocrystal Memories- Part I: Device Design and Fabrication", IEEE Trans. Elect. Dev; vol. 49(9), (Sep. 2002), 1606-1613.

Marlid, Bjorn, et al., "Atomic layer deposition of Bn thin films", Thin Solid Films, 402(12), (Jan. 2002), 167-171.

Min, J., "Metal-organic atomic-layer deposition of titanium-silicon-nitride films", Applied Physics Letters, 75(11), (1999), 1521-1523.

Molnar, R., "Growth of Gallium Nitride by Electron-Cyclotron Resonance Plasma-Assisted Molecular-Beam Epitaxy: The Role of Charged Species", Journal of Applied Physics, 76(8), (Oct. 1994), 4587-4595.

Nakajima, Anri, "Soft breakdown free atomic-layer-deposited silicon-nitride/SiO/sub 2/ stack gate dielectrics", International Electron Devices Meeting. Technical Digest, (2001), 6.5.1-4.

Pankove, J., "Photoemission from GaN", Applied Physics Letters, 25(1), (Jul. 1, 1974), 53-55.

Papadas, C., "Modeling of the Intrinsic Retention Characteristics of FLOTOX EEPROM Cells Under Elevated Temperature Conditions", IEEE Transaction on Electron Devices, 42, (Apr. 1995), 678-682.

Puurunen, R L, et al., "Growth of aluminum nitride on porous silica by atomic layer chemical vapour deposition", Applied Surface Science, 165(2-3), (Sep. 12, 2000), 193-202.

Rao, K. V., et al., "Trench Capacitor Design Issues in VLSI DRAM Cells", 1986 IEEE International Electron Devices Meeting, Technical Digest, Los Angeles, CA, (Dec. 7-10, 1986), 140-143.

Reidy, S., et al., "Comparison of two surface preparations used in the homoepitaxial growth of silicon films by plasma enhanced chemical vapor deposition", J. Vac. Sci. Technol. B 21(3), (May/Jun.), 970-974.

Rhee, H. S, et al., "Cobalt Metallorganic Chemical Vapor Deposition and Formation of Epitaxial CoSl2 Layer on Si(100) Substrate", Journal of Electrochemical Society,146(6), (1999), 2720-2724.

Saito, Y, et al., "High-Integrity Silicon Oxide Grown at Low-temperature by Atomic Oxygen Generated in High-Density Krypton Plasma", Extended Abstracts of the 1999 International Conference on Solid State Devices and Materials, (1999), 152-153.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Su, D. K., et al., "Experimental Results and Modeling Techniques for Substrate Noise in Mixed-Signal Integrated Circuits", IEEE Journal of Solid-State Circuits, 28(4), (Apr. 1993), 420-430.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 8489.

Watanabe, H., "A Novel Stacked Capacitor with Porous-Si Electrodes for High Density DRAMs", 1993 Symposium on VLSI Technology, Digest of Technical Papers, Kyoto, Japan, (1993), 17-18.

Webb, Bucknell C, "High-frequency permeability of laminated and unlaminated, narrow, thin-film magnetic stripes (invited)", Journal of Applied Physics, (1991), 5611, 5613, 5615.

Wei, L S, et al., "Trapping, emission and generation in MNOS memory devices", Solid-State Electronics, 17(6), (Jun. 1974), 591-8.

White, M H, et al., "Characterization of thin-oxide MNOS memory transistors", IEEE Transactions on Electron Devices, ED-19(12), (Dec. 1972), 1280-1288.

White, M H, "Direct tunneling in metal-nitride-oxide-silicon (MNOS) structures", Programme of the 31st physical electronics conference, (1971), 1.

Wilk, G. D, "High-K gate dielectrics: Current status and materials properties considerations", Journal of Applied Physics, 89(10), (May 2001), 5243-5275.

Wilk, G. D., "High-K gate dielectrics: Current status and materials properties considerations", Journal of Applied Physics, 89(10), (May 2001), 5243-5275.

Wilk, G. D., et al., "Stable zirconium silicate gate dielectrics deposited directly on silicon", Applied Physics Letters, vol. 76, No. 1, (Jan. 3, 1000), 112-114.

Williams, Paul A., et al., "Novel Mononuclear Alkoxide Precursors for the MOCVD of ZrO2 and HfO2 Thin Films", Chemical Vapor Deposition, 8(4), (Jul. 2002), 163-170.

Wolf, S., et al., "", Silicon Processing for the VLSI Era—vol. 4: Deep-Submicron Process Technology, Lattice Press, Sunset Beach, CA, (2002), p. 98, 146 173-174.

Wolf, Stanley, "Ion Implantation for VLSI", Silicon Processing for the VLSI Era, vol. 1, Lattice Press, Sunset Beach CA, (1986), 280-330.

Wolf, Stanley, et al., "Silicon Processing for the VLSI Era—vol. I: Process Technology", Second Edition, Lattice Press, Sunset Beach, California, (2000), 443.

Wolf, Stanley, "Silicon Processing for the VLSI ERA, vol. 1", Lattice Press, Sunset Beach, CA, (1986), 308-311.

Wolfram, G, et al., "Existence range, structural and dielectric properties of ZrxTiySnzO4 ceramics (x + y =2)", Materials Research Bulletin, 16(11), (Nov. 1981), 1455-63.

Wood, S W, "Ferroelectric memory design", M.A.Sc. thesis, University of Toronto, (1992).

Xiang, Wenfeng, et al., "Characteristics of LaAlO3/Si(100) deposited under various oxygen pressures", Journal of Applied Physics, vol. 20, No. 1, (Jan. 1, 2003), 533-536.

Xiaoli, Yuan, "Effects of interface traps in silicon-quantum-dots-based memory structures", Physica E, 8(2), (Aug. 2000), 189-193(5).

Xuan, Peiqi, et al., "60nm Planarized Ultra-thin Body Solid Phase Epitaxy MOSFETs", IEEE Device Research Conference, Conference Digest. 58th DRC, (Jun. 19-21, 2000), 6768.

Yagishita, Atsushi, et al., "Dynamic threshold voltage damascene metal gate MOSFET (DT-DMG-MOS) with low threshold voltage, high drive current and uniform electrical characteristics", International Electron Devices Meeting 2000. Technical Digest. IEDM, (Dec. 2000), 663-666.

Yamada, T., et al., "A New Cell Structure with a Spread Source/Drain (SSD) MOSFET and a Cylindrical Capacitor for 64-Mb DRAM's", IEEE Transactions on Electron Devices, 38, (Nov. 1991), 2481-2486.

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., (Dec. 3-6, 1989), 35-38.

Yamaguchi, Takeshi, et al., "Band Diagram and Carrier Conduction Mechanism in ZrO2/Zr-silicate/Si MIS Structure Fabricated by Pulsed-laser-ablation Deposition", Electron Devices Meeting, 2000. IEDM Technical Digest. International, (2000), 19-22.

Yamaguchi, Takeshi, et al., "Study on Zr-Silicate Interfacial Layer of ZrO2-MIS Structure Fabricated by Pulsed Laser Ablation Deposition Method", Solid State Devices and Materials, (2000), 228-229.

Yamamoto, K., "Effect of Hf metal predeposition on the properties of sputtered HfO2/Hf stacked gate dielectrics", Applied Physics Letters, 81, (Sep. 9, 2002), 2053-2055.

Yan, J., "Structural and electrical characterization of TiO/sub 2/ grown from titanium tetrakisisopropoxide (TTIP) and TTIP/H/sub 2/O ambients", Journal of Vacuum Science & Technology B (Microelectronics and Nanometer Structures), 14(3), (May-Jun. 1996), 1706-1711.

Yan, L., "High quality, high-k gate dielectric: amorphous LaAl03 thin films grown on Si(100) without Si interfacial layer", Appl. Phys. A 77, (2003), 721-724.

Yee, A., et al., "The Effect of Nitrogen on Pulsed Laser Deposition of Amorphous Silicon Carbide Films: Properties and Structure", J. Materials Research, 11, (1996), 1979-1986.

Yeh, Ching-Fa, et al., "The advanced improvement of PN mesa junction diode prepared by silicon-wafer direct bonding", 1991 International Symposium on VLSI Technology, Systems, and Applications, 1991. Proceedings of Technical Papers, (May 22-24, 1991), 136-140.

Yih, C. M., et al., "A Consistent Gate and Substrate Current Model for Sub-Micron MOSFET'S by Considering Energy Transport", Int'l Symp. on VLSI Tech., Systems and Applic., Taiwan, (1995), 127-130.

Yoder, M, "Wide bandgap semiconductor materials and devices", IEEE Transactions on Electron Devices, 43(10), (Oct. 1996), 1633-1636.

Yoshikawa, K., "Impact of Cell Threshold Voltage Distribution in the Array of Flash Memories on Scaled and Multilevel Flash Cell Design", 1996 Symposium on VLSI Technology, Digest of Technical Papers, Honolulu, HI, (Jun. 11-13, 1996), 240-241.

Youm, Minsoo, "Metal oxide semiconductor field effect transistor characteristics with iridium gate electrode on atomic layer deposited ZrO2 high-k dielectrics", Jpn. J. Appl. Phys., vol. 42, (Aug. 2003), 5010-5013.

Yu, Xiongfei, et al., "High Mobility and Excellent Electrical Stability of MOSFETs Using a Novel HfTaO Gate Dielectric", 2004 Symposium on VLSI Technology Digest of Technical Papers, (Jun. 15-17, 2004), 110-111.

Yun, Sun Jin, "Effect of plasma on characteristics of zirconium oxide films deposited by plasma-enhanced atomic layer deposition", Electrochemical and Solid-State Letters, 8 (11), (2005), F47-F50.

Zhang, H, et al., "High permittivity thin film nanolaminates", Journal of Applied Physics, 87(4), (Feb. 2000), 1921-1924.

Zhang, H., "Atomic Layer Deposition of High Dielectric Constant Nanolaminates", Journal of the Electrochemical Society, 148(4), (Apr. 2001), F63-F66.

Zhang, Hongguo, et al., "Investigation on Structure and Properties of Low-Temperature Sintered Composite Ferrites", Materials Research Bulletin, 35, (2000), 2207-2215.

Zhao, X., et al., "Nanocrystalline Si: a material constructed by Si quantum dots", Materials Science and Engineering B, 35(1-2), Proceedings of the First International Conference on Low Dimensional Structures and Devices, Singapore, (Dec. 1995), 467-471.

Zhao, Xinyuan, et al., "First-principles study of structural, vibrational, and lattice dielectric properties of hafnium oxide", Physical Review B, vol. 65, (2002), 233106-1 through 233106-4.

Zhenxing, Yue, et al., "Low-Temperature Sinterable Cordicrite Glass-ceramics", High Technology Letters (China), 10 (115), (2000), 96-97.

Zhong, Huicai, et al., "Electrical Properties of Ru and RuO2 Gate Electrodes for Si-PMOSFET with ZrO2 and Zr-Silicate Dielectrics", Journal of Electronic Materials, 30(12), (Dec. 2001), 1493-1498.

Zhu, W J, et al., "Current transport in metal/hafnium oxide/silicon structure", IEEE Electron Device Letters, 23, (2002), 97-99.

Zhu, W, et al., "HfO2 and HfAlO for CMOS: Thermal Stability and Current Transport", IEEE International Electron Device Meeting 2001, (2001), 463-466.

Zucker, O, et al., "Application of Oxygen Plasma Processing to Silicon Direct Bonding", Sensors and Actuators A, 36, (1993), 227-231.

US 6,827,790, 12/2004, Gealy et al. (withdrawn)

\* cited by examiner

DEVICES WITH NANOCRYSTALS AND METHODS OF FORMATION

PRIORITY APPLICATION

This application is a divisional of U.S. application Ser. No. 13/088,777, filed Apr. 18, 2012, which is a divisional of U.S. application Ser. No. 11/185,113, filed Jul. 20, 2005, now issued as U.S. Pat. No. 7,927,948, which are incorporated herein by reference in their entirety.

TECHNICAL FIELD

This application relates generally to semiconductor devices and device fabrication and, more particularly, to forming nanocrystals and other nano structures.

BACKGROUND

The semiconductor device industry has a market driven need to reduce the size and cost of integrated circuits (ICs), including persistent memory devices such as floating gate memory and flash memory. As the dimensions of the memory devices are reduced, the voltage used to program the gates is reduced for reliability reasons associated with the thinner gate dielectric thickness. The thinner gate dielectrics for the smaller IC dimensions may have problems with leakage current levels, and thus the length of time the individual gate can retain the programmed charge may not be sufficient.

The floating gate of flash memory devices can be replaced with small crystals. These small crystals have been referred to as nanocrystals. The nanocrystals are located over the channel region, and separated from the channel region by a gate dielectric. The nanocrystals should be distributed and be capable of holding a sufficient charge so that, if programmed to hold charge, the nanocrystals will control the channel region below the nanocrystals as well as the region between the nanocrystals. Too few nanocrystals, over the entire channel or a portion of the channel, may not be able to control the channel. Too many nanocrystals, over the entire channel or a portion of the channel, may result in a leakage path in the gate dielectric such that some of the charge stored on the nanocrystals may be lost.

DETAILED DESCRIPTION

Figure 1:
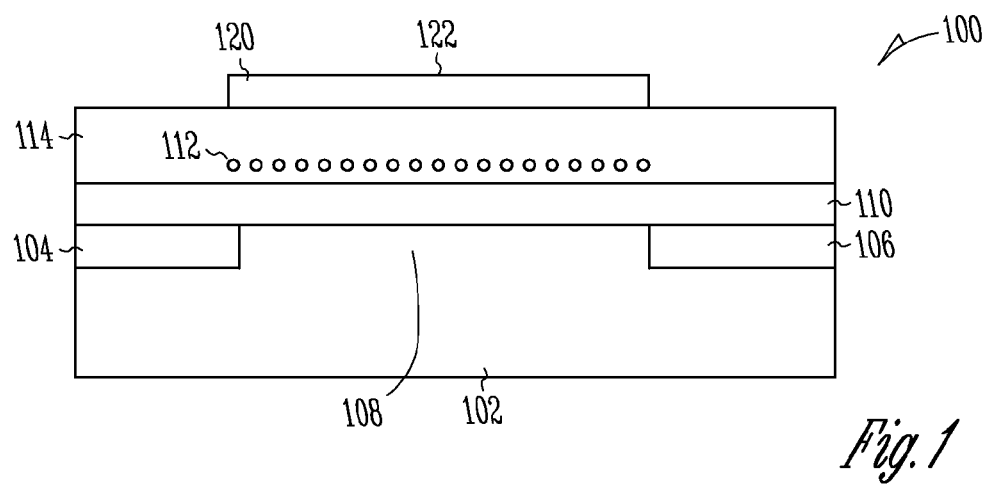
FIG. 1 illustrates an embodiment of a floating gate transistor.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments. The following detailed description is, therefore, not to be taken in a limiting sense, and the scope of the present invention is defined only by the appended claims, along with the full scope of equivalents to which such claims are entitled.

The terms "wafer" and "substrate" used in the following description include any structure having an exposed surface with which to form an integrated circuit (IC) structure or a micro electro-mechanical (MEM) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors or as semiconductors. The term "high work function" is understood to generally include all materials having a higher work function than that of heavily doped polycrystalline silicon. The term "high dielectric constant" is understood to generally include all materials having a higher dielectric constant than the 3.9 value of silicon dioxide. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Disclosed herein, among other things, is a method for providing a controllable distribution of the nucleation sites across the surface of the substrate for use in growing nanoscale structures. Thus, the density and spatial distribution of nanostructures, such as nanocrystals, can be controlled. In nonvolatile memory embodiments where the nanocrystals function as a floating gate, the distribution and size of the nanocrystals is sufficiently uniform to hold a charge sufficient to control the channel region.

An aspect relates to a method of growing nanoscale structures on a semiconductor substrate. According to various embodiments, nucleation sites are created on a surface of the substrate. The creation of the nucleation sites includes implanting ions with an energy and a dose selected to provide a controllable distribution of the nucleation sites across the surface of the substrate. Nanoscale structures are grown using the controllable distribution of nucleation sites to seed the growth of the nanoscale structures. According to various embodiments, the nanoscale structures include at least one of nanocrystals, nanowires and nanotubes. According to various nanocrystal embodiments, the nanocrystals are positioned within a gate stack and function as a floating gate for a nonvolatile device.

An aspect relates to a method of growing nanocrystals on a semiconductor substrate. According to various embodiments, nucleation sites are created on a surface of the substrate. The creation of the nucleation sites includes including implanting ions with an energy and a dose selected to provide a controllable distribution of the nucleation sites across the surface of the substrate. Material is deposited to grow nanocrystals using the controllable distribution of nucleation sites to seed the growth of the nanocrystals.

The present subject matter provides a method for creating nucleation sites with a controllable density and distribution for use in growing nanoscale structures.

The processes illustrated in this disclosure can be used to provide devices with nanoscale structures with a controllable density and distribution. Examples of nanoscale structures include nanocrystals, nanowires, and nanotubes. To simplify the disclosure, a non-volatile memory embodiment with a floating gate formed by nanocrystals is discussed below. Those of ordinary skill in the art will understand, upon reading and comprehending this disclosure, how to control the density and distribution of nanostructures, such as nanocrystals, nanowires and nanotubes.

A gate dielectric in a transistor has both a physical gate dielectric thickness and what may be referred to as an equivalent oxide thickness, using the silicon dioxide ($SiO_2$) gate dielectric as the standard of comparison. The equivalent oxide thickness is a measure of the electrical properties of the gate dielectric, such as capacitance per unit area. Equivalent oxide thickness refers to the thickness of a theoretical $SiO_2$ layer that would have the same electrical properties as the dielectric layer, and is often useful when dealing with gate dielectrics having dielectric constants that are higher than the 3.9 value of silicon dioxide. High dielectric constant materials are useful in transistors of reduced dimensions. The physical thickness of the high dielectric may be much larger than the electrical equivalent value, and thus higher transistor speed may be obtained without the increased leakage rate and decreased reliability that would be found in an equivalent silicon dioxide gate dielectric. For example, a dielectric material with a dielectric constant of 10 would have a physical thickness of 2.5 nanometers to provide the same speed performance as a silicon dioxide thickness of only 1.0 nanometer, and would have better leakage characteristics due to the greater physical thickness. A high dielectric constant gate dielectric may be useful in the present subject matter, including the reduced leakage current values from the individual nanocrystals of the floating gate to the substrate, resulting in increased data retention values. High work function material may be useful in the present subject matter by adjusting the tunneling barrier to adjust the programming barriers and speed.

FIG. 1 illustrates an embodiment of a floating gate transistor 100 having a substrate 102, a source diffusion region 104 having an opposite doping type from the substrate, and a drain diffusion region 106, having the same doping type as the source region 104. The area of the substrate 102 between the source 104 and the drain 106 is known as the channel. The channel allows conduction between the source and drain if the gate 112 has an appropriate charge. The amount of charge on the gate 112 needed to allow conduction depends on factors including the thickness and dielectric constant of the gate insulator 110, the doping level of the substrate 102 and the channel 108, and leakage between the gate 112 and the substrate. The gate 112 in the present embodiment is what is known as a floating gate that has no direct electrical connection to any signal, electrode or substrate, and is formed of many small closely spaced nanoparticles in non contacting proximity to one another. These small closely spaced nanoparticles may be known as nanocrystals and act as a single electrode if the spaces between the nanocrystals are small enough to control the region of the channel 108 surrounding the nanocrystal. A floating gate formed from nanocrystals has also been referred to as a floating plate. The transistor 100 also includes an inter-gate dielectric layer 114 and a control electrode 120, which may be formed of any gate electrode material. The control electrode is connected to signal over conductor 122.

Nanocrystals such as those of floating electrode 112 may be grown in a number of ways using well known methods such as atomic layer deposition (ALD), chemical vapor deposition (CVD), plasma enhanced CVD (PECVD), physical vapor deposition (PVD), and spin coating. Various nanocrystal embodiments include metals and various nanocrystal embodiments include insulators. For example, the nanocrystals may be made of any gate electrode material, including high work function materials. Various nanocrystal embodiments include platinum (Pt), various nanocrystal embodiments include rhodium (Rh), various nanocrystal embodiments include ruthenium (Ru), various nanocrystal embodiments include palladium (Pd), various nanocrystal embodiments include cobalt (Co), various nanocrystal embodiments include silicon (Si), various nanocrystal embodiments include titanium (Ti), various nanocrystal embodiments include zirconium (Zr), various nanocrystal embodiments include hafnium (Hf), various nanocrystal embodiments include tantalum (Ta), various nanocrystal embodiments include tungsten (W), various nanocrystal embodiments include tantalum nitride (TaN), various nanocrystal embodiments include titanium nitride (TiN), various nanocrystal embodiments include tungsten nitride (WN), various nanocrystal embodiments include titanium oxide ($TiO_x$), various nanocrystal embodiments include cobalt oxide ($CoO_x$), various nanocrystal embodiments include ruthenium oxide ($RuO_x$), various nanocrystal embodiments include hafnium oxide ($HfO_x$), various nanocrystal embodiments include aluminum oxide ($Al_2O_3$), various nanocrystal embodiments include tungsten oxide ($WO_x$), various nanocrystal embodiments include titanium carbide (TiC), various nanocrystal embodiments include tantalum carbide (TaC), various nanocrystal embodiments include tungsten carbide (WC), and various nanocrystal embodiments include various combinations of these materials.

If the nanocrystals of floating gate 112 are substantially in direct electrical contact with one another, then the floating gate will function as a single gate electrode. If there is a leakage path somewhere in the gate insulator 110, then the charge stored in the gate electrode 112 will disappear over time, and the data retention of the transistor 100 will be unacceptable. Even if the entire floating gate 112 does not discharge, but a substantial portion of the gate electrode 112 has a leakage path, then the channel region will block or limit current flow in the region of the channel 108 corresponding to the leakage path, and the transistor 100 will either be non-conductive, or conductive at a level too low for proper operation.

With respect to nonvolatile memory embodiments with floating gates formed from nanocrystals, it is desired to have the floating gate nanocrystals close enough together to electrically control the space between the nanocrystals, but not to have the nanocrystals be too large or to be in direct electrical contact with each other. For example, one sub-50 nm nonvolatile memory embodiment has approximately 100 nanocrystals in a 40 by 40 nanometer channel region, with the nanocrystals being around 2 nanometers in size and about 2 nanometers in separation from one another. Other embodiments are anticipated to accommodate other device dimensions, and other structures with nanocrystal distributions are contemplated.

One method to provide control of the size and spacing of the nanocrystals provides nucleation sites to initiate the ALD or CVD chemical reactions to begin to form nanocrystals. The nucleation sites may be formed by damage locations in the top surface of the gate dielectric, or by ion implantation of atoms into or onto the top surface of the dielectric. Normal energy ion implantation energies such as fifteen thousand electron volts (15 KeV) using boron ions may result in inadequate dielectric damage at the surface and undesirable amounts of damage deeper in the gate dielectric, resulting in leakage paths or short circuits due to the relatively high speed of the ion. Low energy ion implantation resulting in ions or atoms that stick out of the surface of the gate dielectric may most efficiently form the nucleation sites.

Figure 2:
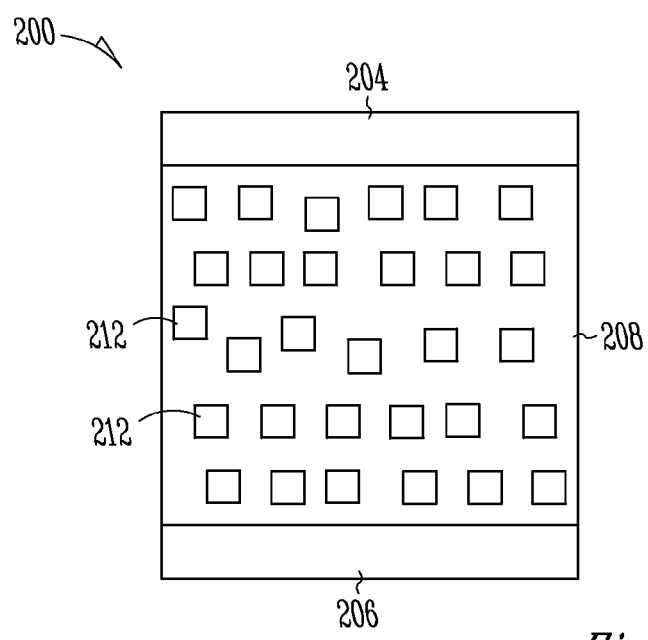
FIG. 2 shows a top view of a transistor channel region for a floating gate transistor embodiment.

FIG. 2 shows a top view of a transistor channel region for a floating gate transistor embodiment. The illustrated transistor 200 has a source diffusion region 204, a drain diffusion region 206, and a channel region 208. A gate dielectric is not shown for simplicity. A number of nanocrystals 212 are distributed substantially evenly over the entire area of the channel 208. In the illustration, none of the nanocrystals are touching one another. According to a sub-50 nm nonvolatile memory embodiment, the channel region is about 40 nanometers on a side and contains about 100 nanocrystals having a size of about 2 nanometers and a spacing of about 2 nanometers. Not all of the nanocrystals will be exactly 2 nanometers and have a 2 nanometer spacing, nor will every nanocrystal be electrically isolated as shown in the figure. However, the present subject matter is capable of providing nanocrystals with substantially even distribution in size and in spacing. If the spacing becomes too large, then regions of the channel 208 will not be turned on as programmed, resulting in either lower source 204 to drain 206 conduction, or an open circuit. Leakage paths can potentially develop if the nanocrystals 212 are too large or in direct electrical contact. Such leakage paths across the gate dielectric will reduce the charge stored by the corresponding nanocrystals, and potentially result in regions of the channel 208 that are not as conductive as desired, and potentially result in reduced data retention periods.

Figure 3:
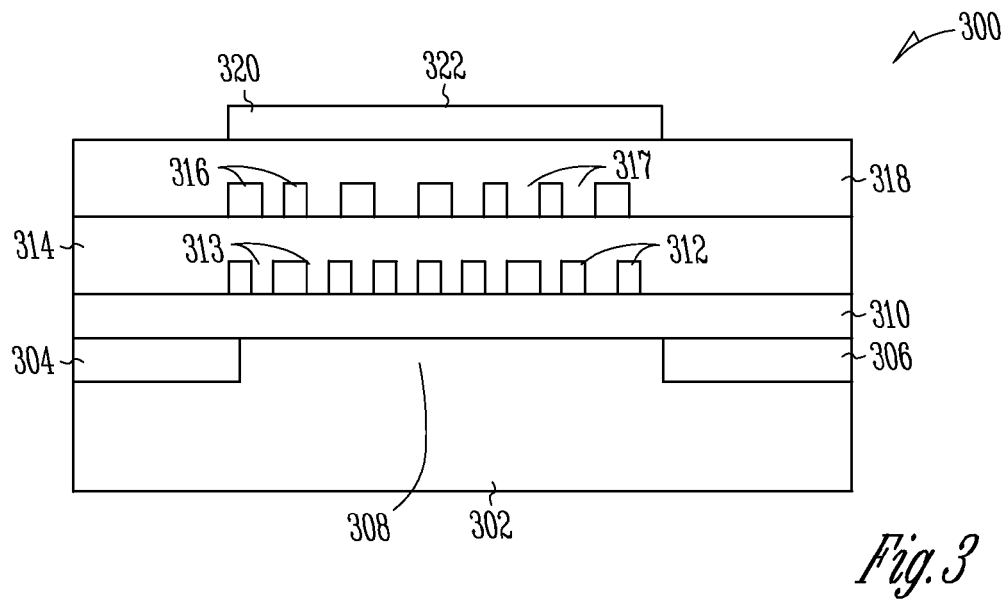
FIG. 3 illustrates an embodiment of a transistor having one or more levels of nanocrystal floating gates.

FIG. 3 illustrates an embodiment of a transistor having one or more levels of nanocrystal floating gates. In this illustrative embodiment the nanocrystals are shown as individual elements with a first layer of nanocrystals 312 and a second layer of nanocrystals 316. The present subject matter has embodiments having only a single layer of nanocrystals 312, or two, three or even more individual layers of nanocrystals. Each of the individual layers of nanocrystals may have a controlled size crystal and a substantially uniform distribution of electrically isolated nanocrystals. This illustrative embodiment has a transistor 300 formed on a substrate 302, which may be a silicon substrate of either P type or N type, an epitaxial layer grown on a silicon substrate or on an insulative substrate such as sapphire. The substrate may also be all other semiconductive material such as amorphous silicon, polycrystalline silicon, germanium, gallium arsenide, or any other compound semiconductor and still be within the inventive subject matter. The substrate has a source region 304 and a drain region 306 with a channel region 308 between the source and drain. There is a gate dielectric 310, which may be silicon oxide, silicon nitride, silicon oxynitride, or any other dielectric or insulative material, including high dielectric constant materials such as alumina, titanium dioxide, hafnium dioxide, tantalum dioxide, barium titanate, and the like. The gate dielectric 310 separates the floating gate electrode 312 from the channel region and the source and drain regions. The gate electrode 312 in this embodiment is formed of individual nanocrystals 312 of material capable of storing a charge. For example, the nanocrystals can be formed from any gate electrode material, such as polysilicon, refractory metals such as tungsten, high work function materials such as silicon carbide, or other conductive material or semiconductor material capable of forming nanocrystals with the desired properties to function as the floating gate of a floating gate nonvolatile memory device. The nanocrystals also can be formed from insulators, such as $RuO_x$, $CoO_x$, $TiO_2$ and the like. The first floating gate 312 has spaces 313 between each of the nanocrystals so that the nanocrystals are electrically isolated from each other. The first layer of nanocrystals has a first inter-gate dielectric layer 314, which may be formed of any dielectric material as above, upon which a second layer of nanocrystals 316 is formed as above with reference to the first layer of nanocrystals 312. The second layer of nanocrystals 316 has spaces 317 separating the nanocrystals. The second layer of nanocrystals has a second inter-gate dielectric layer 318 formed as above, which separates the second nanocrystal layer from the control gate 320, which is connected to an input signal 322 from either an adjacent transistor or from an external source. The formation of the dielectric layers can use a variety of processes, such as chemical vapor deposition, atomic layer deposition, evaporation, and the like, as may be appropriate for the dielectric type and size. Any dielectric deposition technique may be used which results in very conformal coverage of nanocrystals and which provides a good quality dielectric with degradation of the nanocrystals. Degradation of nanocrystals may occur because of the temperature or corrosiveness of the deposition temperature. There may be additional layers of nanocrystal floating gates formed in the same manner. Such transistors as those discussed in FIGS. 1 to 3 may be used in logic devices as local memory, as non-volatile memory arrays such as flash memory, or in almost any electronic device. Some embodiments will treat the nanocrystals, such as illustrated at 312 or 316, before depositing their corresponding subsequent intergate dielectric, such as illustrated at 314 and 318. For example, the nanocrystals can be oxidized.

For floating gate embodiments, the size of the nanocrystals can range from about 0.5 nanometers to about 5 nanometers, and the average spacing between nanocrystals can range from about 0.5 nanometers to about 5 nanometers. It is expected that approximately 80% or more of the nanocrystals will fall within these ranges. According to various sub-50 nm non-volatile memory embodiments, an average size of the nanocrystals is 2 nanometers with a spacing between nanocrystals of about 2 nanometers. According to various embodiments, the electrically isolated nanocrystals have a maximum diameter of 4.0 nanometers and a density of greater than one nanocrystal per 15 square nanometers.

Figure 4:
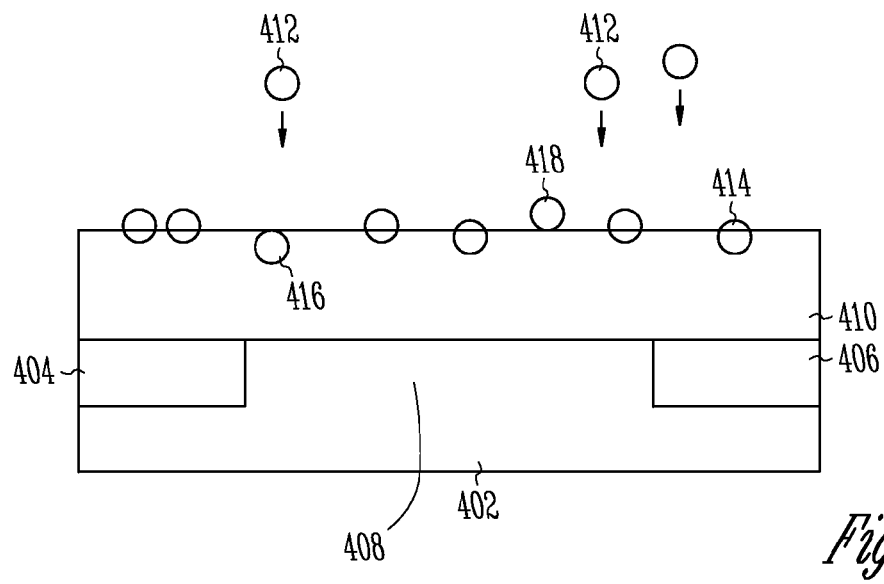
FIG. 4 illustrates an embodiment of ion implantation nucleation.

FIG. 4 illustrates an embodiment of ion implantation nucleation. The transistor is shown in an intermediate step of the manufacturing process, when a device having a semiconductive substrate 402 with source 404 and drain 406 formed on a surface of the substrate. The drawing is meant to illustrate the implantation of nucleation sites, and is not drawn to scale. There is a channel region 408 and a gate insulator layer 410. The nucleation sites may be formed over the entire wafer as shown, or only over the channel region 408 by simple photo-masking or other well known masking procedures, to limit the ion implantation to the channel region of the gate dielectric 410. The nucleation sites may be damage locations in the top surface of the gate dielectric 410 caused by the passage of relatively heavy ions such as argon, or they may be atoms of the ion implanted material sticking up from the gate dielectric surface as shown. The depth range of the implanted ion should be small to cause the ions to stop at the top surfaces, or at least near the top surface to avoid excessive gate dielectric damage. For example, according to various embodiments, the implanted ions do not travel past the top 1 nanometer of the gate dielectric layer 410 or do not travel past the top ⅕ of the gate dielectric layer 410.

The ions 412 may be formed by any method of ion formation and acceleration, including plasma systems such as plasma doping systems (PLAD). The ion energy should be low enough to prevent any of the ions 412 from moving fast enough in the direction indicated by the arrows toward the gate dielectric 410 to penetrate the gate dielectric layer. Various types of ions may be used, such as typical dopant species such as boron, phosphorous or arsenic. The ions may be of the material that will form the nanocrystals, or the ions may be of inert gases such as argon, neon, helium and xenon, or the ions may be semiconductor materials such as silicon, carbon, germanium or other ions. The dose of the ion has an affect on the uniformity of the distribution of eventual nanocrystals grown and on the size of the nanocrystals.

Typical ion energies depend upon the mass of the ion, and should be set to partially embed the ions 412 into the surface of the gate dielectric 410 either partially, as shown with ion 414, entirely embedded forming a persistent defect in the surface of the gate dielectric, as shown with ion 416, or slightly so as to remain entirely on the surface of the gate dielectric, as shown with ion 418. Typical ion energies found with PLAD are a few dozen electron volts (eV). Typical ion densities expressed in the number of ions per unit surface area are in the $10^{12}$ ions/cm$^2$ levels. The ions should preferably be deposited in a discontinuous layer on the surface of the gate dielectric 410. According to various floating gate embodiments for sub-50 nm memories, the range of energies for implanting boron ion(s) into a silicon dioxide gate dielectric extend from approximately 0.01 KeV to approximately 2.0 KeV with a dose of ranging from approximately 1E11 ions/cm$^2$ to approximately 1E14 ions/cm$^2$. The energy and dose ranges depend on the ions and the gate dielectric. Thus, appropriate energies and doses can be selected to implant a variety of ions on the surface or shallowly below the surface of a variety of gate dielectrics.

Structures such as shown in FIG. 1, 2, 3 or 4 may be used in any integrated circuit or transistor devices, such as flash memory devices as well as other memory, logic or information handling devices and systems. Embodiments of these information handling devices include wireless systems, telecommunication systems, computers and integrated circuits.

Figure 5:
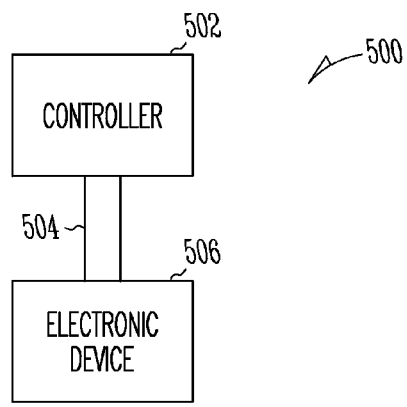
FIG. 5 is a block diagram of an embodiment of an electronic system.

FIG. 5 is a block diagram of an embodiment of an electronic system. The illustrated electronic system 500 has one or more devices having portions of the circuits with nonvolatile memory devices, with nanocrystals as disclosed herein. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a portion of the device design used for nanocrystal floating gate transistors as previously discussed herein. Electronic system 500 may include, but is not limited to, information handling devices, wireless systems, telecommunication systems, fiber optic systems, electro-optic systems, and computers.

Figure 6:
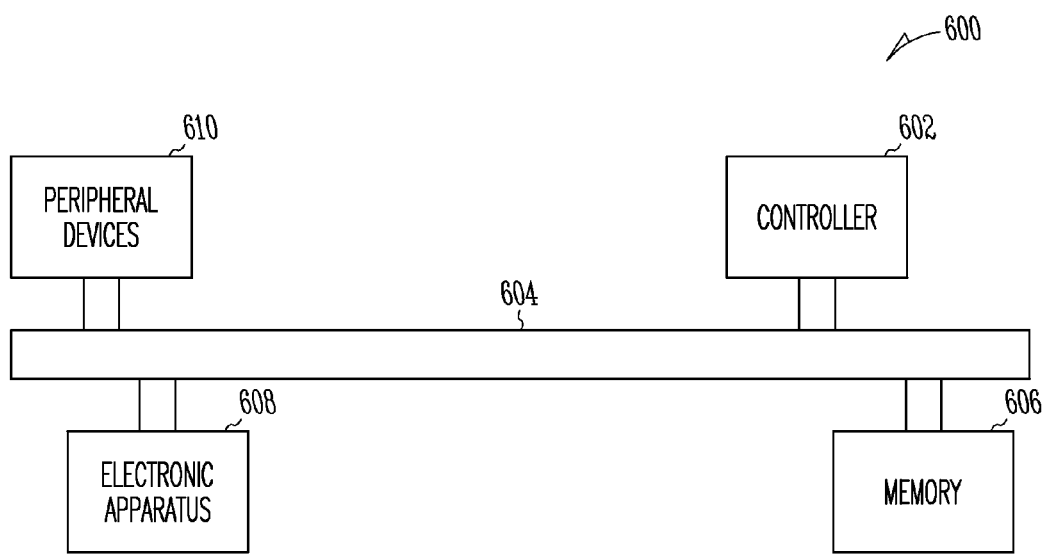
FIG. 6 is a diagram of an embodiment of an electronic system having devices.

FIG. 6 depicts a diagram of an embodiment of a system 600 having a controller 602 and a memory 606. Controller 602 and/or memory 606 include a portion of the circuit for selectively heating the device to a desired temperature. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment controller 602 is a processor. Any of controller 602, memory 606, bus 604, electronic apparatus 608, and peripheral device or devices 610 may include a nonvolatile memory in accordance with the disclosed embodiments. System 600 may include, but is not limited to, information handling devices, telecommunication systems, and computers. Peripheral devices 610 may include displays, additional memory, or other control devices operating in with controller 602 and/or memory 606.

The present subject matter provides a method for creating nucleation sites with a controllable density and distribution for use in growing nanoscale structures. The nucleation sites are created using low energy ion implantation techniques to create the nucleation sites at or near the top surface of material in which the ions are implanted. Thus, the processes illustrated in this disclosure are able to seed the growth of nanoscale structures, such as nanocrystals, nanowires and nanotubes, such that the resulting nanoscale structures have a controllable density and distribution. Nanocrystals can be used for a variety of purposes, such as storing charge, enhancing tunneling, and channeling current to increase current density. The floating gate embodiment provided above is an example of a device where the nanocrystals are used to store charge. Such charge storing nanocrystals can also be used to selectively store charge in a body of a transistor in a nonvolatile memory design, such as illustrated in, for example, US Patent Application Publication 2004/0041208, entitled "One Transistor SOI Non-Volatile Random Access Memory Cell". Some embodiments may use nanocrystals to enhance tunneling, such as may be beneficial between a control gate and a floating gate. Enhanced charge tunneling is illustrated in, for example, US Patent Application Publication 2003/0042534, entitled "Scalable Flash/NV Structure and Device with Extended Endurance". Additionally, nanocrystals can be used to provide a path for a locally high current density, such as may be useful for fast ionic or phase change memory devices. Thus, a locally high current density can be provided for a relatively large electrode.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention, including but not limited to. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of forming a floating gate transistor, comprising:
   forming at least one pair of isolated diffused regions having a first doping type and a first doping level in a top surface of a substrate having a second doping type and a second doping level;
   forming a gate dielectric having a first thickness disposed above the top surface of the substrate at least between the pair of isolated diffusions;
   forming a plurality of isolated nucleation sites in the gate dielectric;
   forming a plurality of isolated nanocrystals on a top surface of the gate dielectric;
   forming an inter-gate dielectric having a second thickness disposed over the plurality of nanocrystals; and
   forming a control gate electrode disposed over the inter-gate dielectric.

2. The method of claim 1, wherein the nucleation sites in the gate dielectric are substantially all in the top quarter of the gate dielectric first thickness.

3. The method of claim 2, wherein the nucleation sites in the gate dielectric are substantially all on a top surface of the gate dielectric.

4. The method of claim 1, wherein the nucleation sites are formed by ion implantation.

5. The method of claim 4, wherein the ion implantation comprises a plasma doping operation.

6. The method of claim 4, wherein boron ions are implanted into silicon dioxide with an ion energy within a range from approximately 0.01 KeV to approximately 2.0 KeV, and with an ion dose within a range from approximately 1E11 ions/cm$^2$ to approximately 1E14 ions/cm$^2$.

7. The method of claim 1, wherein approximately 80% or more of the nanocrystals have diameters within a range of approximately 0.5 nanometers to approximately 5 nanometers, and are separated from each other by a separation distance within a range from approximately 0.5 nanometers to approximately 5 nanometers.

8. The method of claim 1, wherein the first doping type is a P type and the second doping type is an N type.

9. The method of claim 1, wherein the nanocrystals comprise a metal material.

10. The method of claim 1, wherein the nanocrystals comprise an insulator material.

11. The method of claim 1, wherein the nanocrystals comprise a semiconductor material.

12. The method of claim 1, wherein the nanocrystals comprise a high work function material.

13. The method of claim 1, wherein the nanocrystals comprise platinum (Pt), rhodium (Rh), ruthenium (Ru), palladium (Pd), cobalt (Co), silicon (Si), titanium (Ti), zirconium (Zr), hafnium (Hf), tantalum (Ta), tungsten (W), tantalum nitride (TaN), titanium nitride (TiN), tungsten nitride (WN), titanium oxide (TiO$_x$), cobalt oxide (CoO$_x$), ruthenium oxide (RuO$_x$), hafnium oxide (HfO$_x$), aluminum oxide (Al$_2$O$_3$), tungsten oxide (WO$_x$), titanium carbide (TiC), tantalum carbide (TaC), or tungsten carbide (WC).

14. The method of claim 1, wherein the nanocrystals comprise combinations of two or more of platinum (Pt), rhodium (Rh), ruthenium (Ru), palladium (Pd), cobalt (Co), silicon (Si), titanium (Ti), zirconium (Zr), hafnium (Hf), tantalum (Ta), tungsten (W), tantalum nitride (TaN), tungsten nitride (WN), titanium nitride (TiN), titanium oxide (TiO$_x$), cobalt oxide (CoO$_x$), ruthenium oxide (RuO$_x$), hafnium oxide (HfO$_x$), aluminum oxide (Al$_2$O$_3$), tungsten oxide (WO$_x$), titanium carbide (TiC), tantalum carbide (TaC), or tungsten carbide (WC).

15. The method of claim 1, wherein the ion implanted includes boron, nitrogen, neon, argon, krypton, platinum, ruthenium, rhodium, palladium, titanium, zirconium, hafnium, silicon, germanium, cobalt, or tantalum.

16. A method of forming a floating gate transistor, comprising:
   forming at least one pair of isolated diffused regions having a first doping type and a first doping level in a top surface of a substrate having a second doping type and a second doping level, wherein a length between the two isolated diffused regions is approximately 40 nanometers and a width of the region between the two isolated diffused regions is approximately 40 nanometers forming a 40 by 40 nanometer channel region;
   forming a gate dielectric having a first thickness disposed above the top surface of the substrate at least between the pair of isolated diffusions;
   forming a plurality of isolated nucleation sites in the gate dielectric;
   forming isolated nanocrystals on a top surface of the gate dielectric with a substantially even statistical distribution across the channel region;
   forming an inter-gate dielectric having a second thickness disposed over the plurality of nanocrystals; and
   forming a control gate electrode disposed over the inter-gate dielectric.

17. The method of claim 16, wherein there are approximately 100 electrically isolated nanocrystals distributed substantially evenly across the channel region.

18. The method of claim 16, wherein approximately 80% or more of the nanocrystals have diameters within a range of approximately 0.5 nanometers to approximately 5 nanometers, and are separated from each other by a separation distance within a range from approximately 0.5 nanometers to approximately 5 nanometers.

19. The method of claim 16, further comprising electrically interconnecting the plurality of transistors to form a memory device.

20. A method of forming a floating gate transistor, comprising:
   forming at least one pair of isolated diffused regions having a first doping type and a first doping level in a top surface of a substrate having a second doping type and a second doping level;
   forming a gate dielectric having a first thickness disposed above the top surface of the substrate at least between the pair of isolated diffusions;
   performing ion implantation to form a plurality of isolated nucleation sites in the gate dielectric;
   forming a plurality of isolated nanocrystals on a top surface of the gate dielectric;
   forming an inter-gate dielectric having a second thickness disposed over the plurality of nanocrystals; and
   forming a control gate electrode disposed over the inter-gate dielectric.

21. The method of claim 20, wherein boron ions are implanted into silicon dioxide with an ion energy within a range from approximately 0.01 KeV to approximately 2.0 KeV, and ions are implanted with an ion dose within a range from approximately 1E11 ions/cm$^2$ to approximately 1E14 ions/cm$^2$.

22. The method of claim 20, wherein the nucleation sites in the gate dielectric are substantially all on a top surface of the gate dielectric.

23. The method of claim 20, wherein the ion implantation comprises a plasma doping operation.

24. The method of claim 20, wherein approximately 80% or more of the nanocrystals have diameters within a range of approximately 0.5 nanometers to approximately 5 nanometers, and are separated from each other by a separation distance within a range from approximately 0.5 nanometers to approximately 5 nanometers.

25. The method of claim 20, wherein the nanocrystals comprise a material selected from the list including platinum (Pt), rhodium (Rh), ruthenium (Ru), palladium (Pd), cobalt (Co), silicon (Si), titanium (Ti), zirconium (Zr), hafnium (Hf), tantalum (Ta), tungsten (W), tantalum nitride (TaN), tungsten nitride (WN), titanium nitride (TiN), titanium oxide ($TiO_x$), cobalt oxide ($CoO_x$), ruthenium oxide ($RuO_x$), hafnium oxide ($HfO_x$), aluminum oxide ($Al_2O_3$), tungsten oxide ($WO_x$), titanium carbide (TiC), tantalum carbide (TaC), tungsten carbide (WC), and combinations thereof.

26. The method of claim 20, wherein performing ion implantation includes implanting an ion species selected from a group of ions consisting of boron, nitrogen, neon, argon, krypton, platinum, ruthenium, rhodium, palladium, titanium, zirconium, hafnium, silicon, germanium, cobalt, and tantalum.

* * * * *